(12) United States Patent
Whetsel

(10) Patent No.: US 7,669,099 B2
(45) Date of Patent: Feb. 23, 2010

(54) OPTIMIZED JTAG INTERFACE

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/182,605

(22) Filed: Jul. 30, 2008

(65) Prior Publication Data

US 2008/0288843 A1    Nov. 20, 2008

Related U.S. Application Data

(62) Division of application No. 11/370,017, filed on Mar. 7, 2006, now Pat. No. 7,421,633.

(60) Provisional application No. 60/663,953, filed on Mar. 21, 2005.

(51) Int. Cl.
*G01R 31/28* (2006.01)
(52) U.S. Cl. ...................... 714/727; 714/729
(58) Field of Classification Search ................. 714/724, 714/726, 727, 729
See application file for complete search history.

(56) References Cited

U.S. PATENT DOCUMENTS

| | | | | |
|---|---|---|---|---|
| 5,056,093 A | * | 10/1991 | Whetsel | 714/729 |
| 5,222,068 A | * | 6/1993 | Burchard | 714/727 |
| 5,828,825 A | * | 10/1998 | Eskandari et al. | 714/27 |
| 6,430,718 B1 | * | 8/2002 | Nayak | 714/727 |
| 6,631,504 B2 | * | 10/2003 | Dervisoglu et al. | 716/4 |
| 2002/0049928 A1 | * | 4/2002 | Whetsel et al. | 714/30 |
| 2004/0044491 A1 | * | 3/2004 | Yonaga et al. | 702/118 |
| 2004/0177300 A1 | * | 9/2004 | Biewenga et al. | 714/727 |

OTHER PUBLICATIONS

"Synchronizing the IEEE 1149.1 test access port for chip level testability" by Bhavsar, This paper appears in: Design & Test of Computers, IEEE Publication Date: Apr.-Jun. 2000 vol. 17, Issue: 2 On pp. 94-99 ISSN: 0740-7475 INSPEC Accession No. 6611672.*

"A hierarchical test control architecture for core based design" by Lee et al. This paper appears in: Test Symposium, 2000. (ATS 2000). Proceedings of the Ninth Asian Publication Date: 2000 On pp. 248-253 ISBN: 0-7695-0887-1 INSPEC Accession No. 6846335.*

* cited by examiner

*Primary Examiner*—Cynthia Britt
(74) *Attorney, Agent, or Firm*—Lawrence J. Bassuk; W. James Brady; Frederick J. Telecky, Jr.

(57) ABSTRACT

An optimized JTAG interface is used to access JTAG Tap Domains within an integrated circuit. The interface requires fewer pins than the conventional JTAG interface and is thus more applicable than conventional JTAG interfaces on an integrated circuit where the availability of pins is limited. The interface may be used for a variety of serial communication operations such as, but not limited to, serial communication related integrated circuit test, emulation, debug, and/or trace operations.

7 Claims, 21 Drawing Sheets

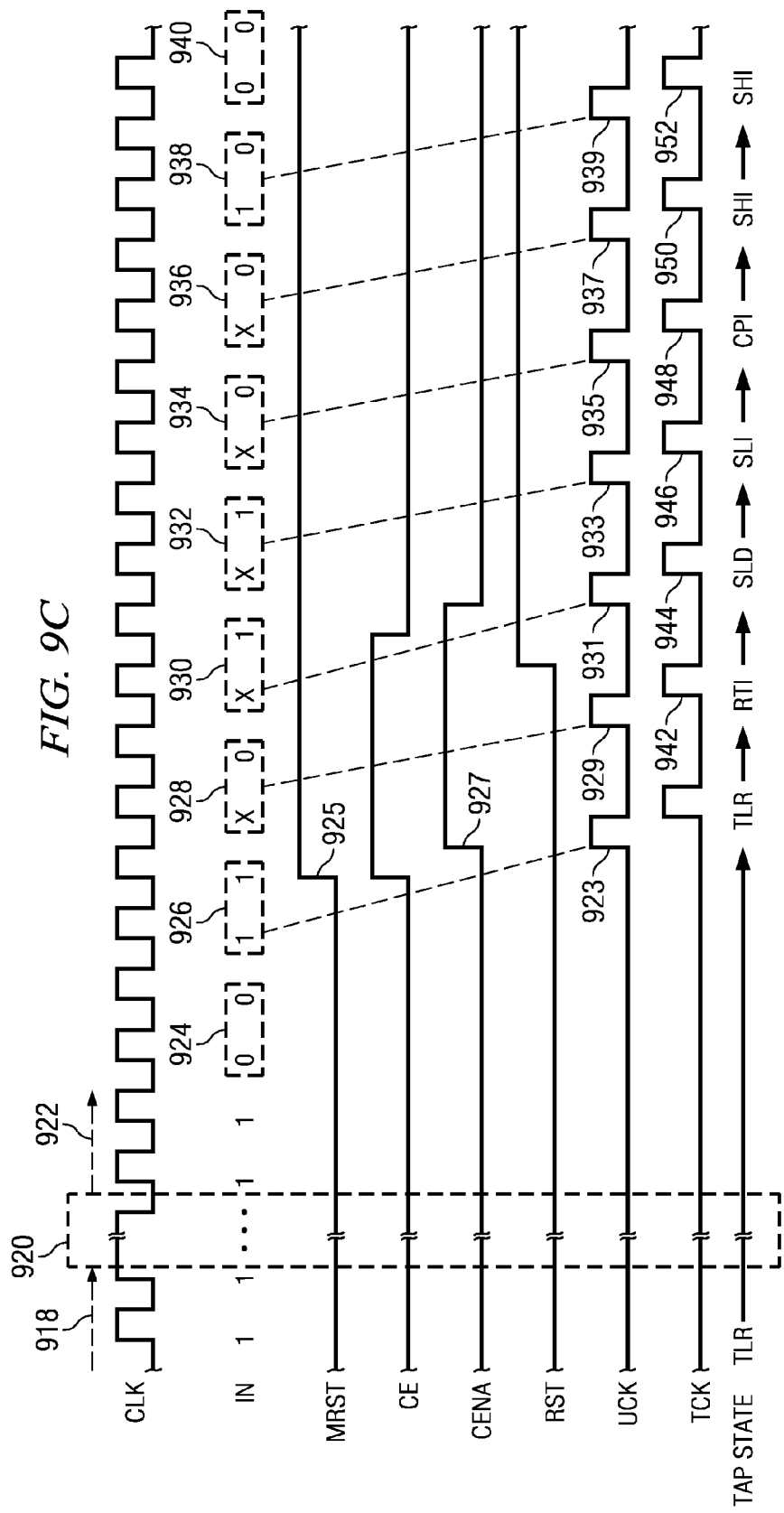

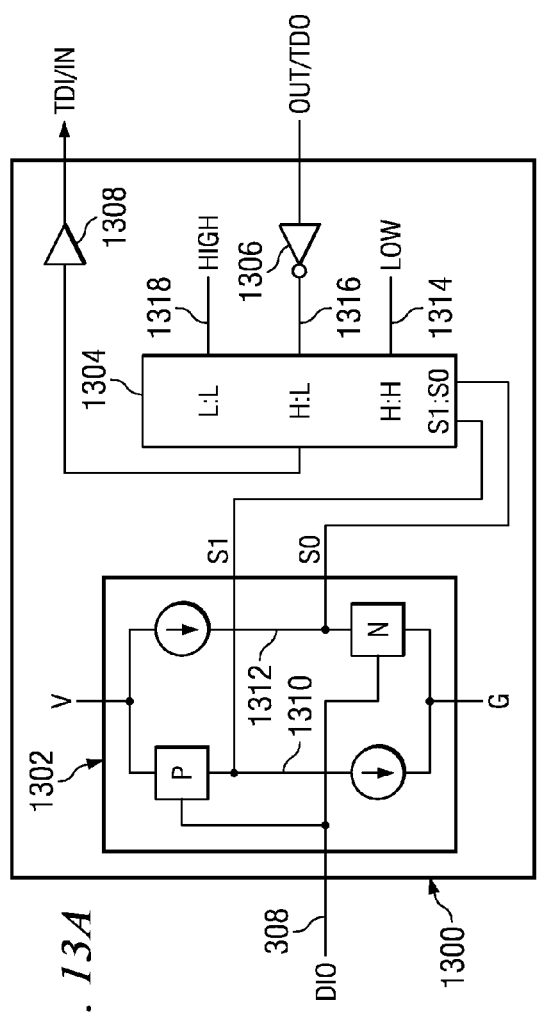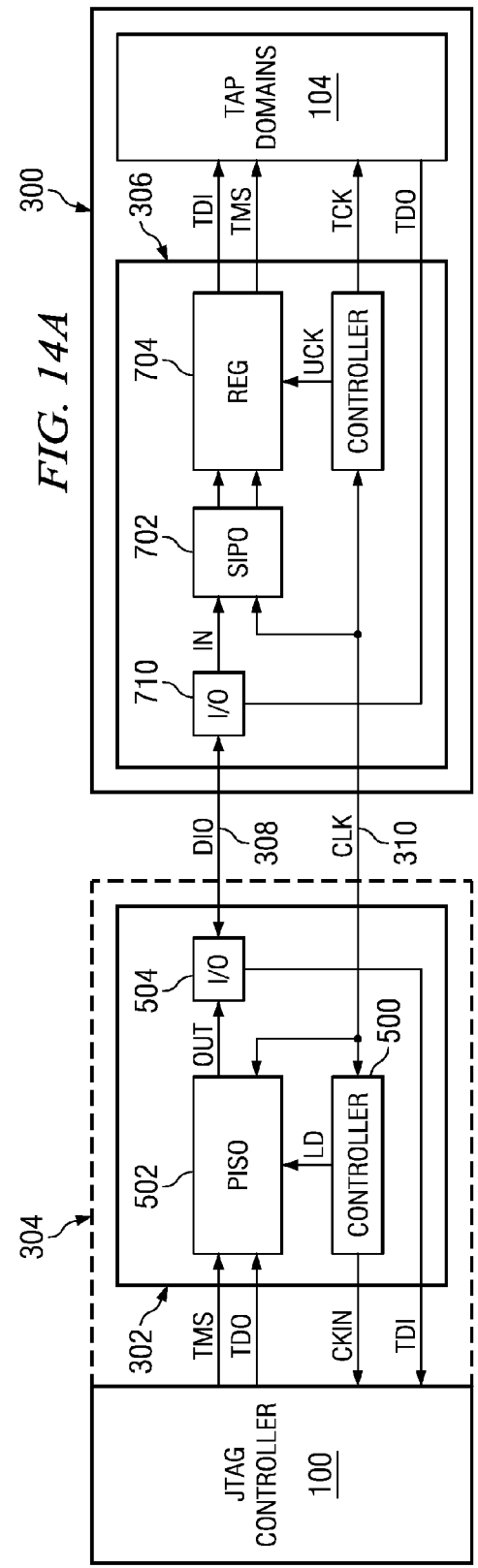
FIG. 13B
FIG. 13A
FIG. 14A

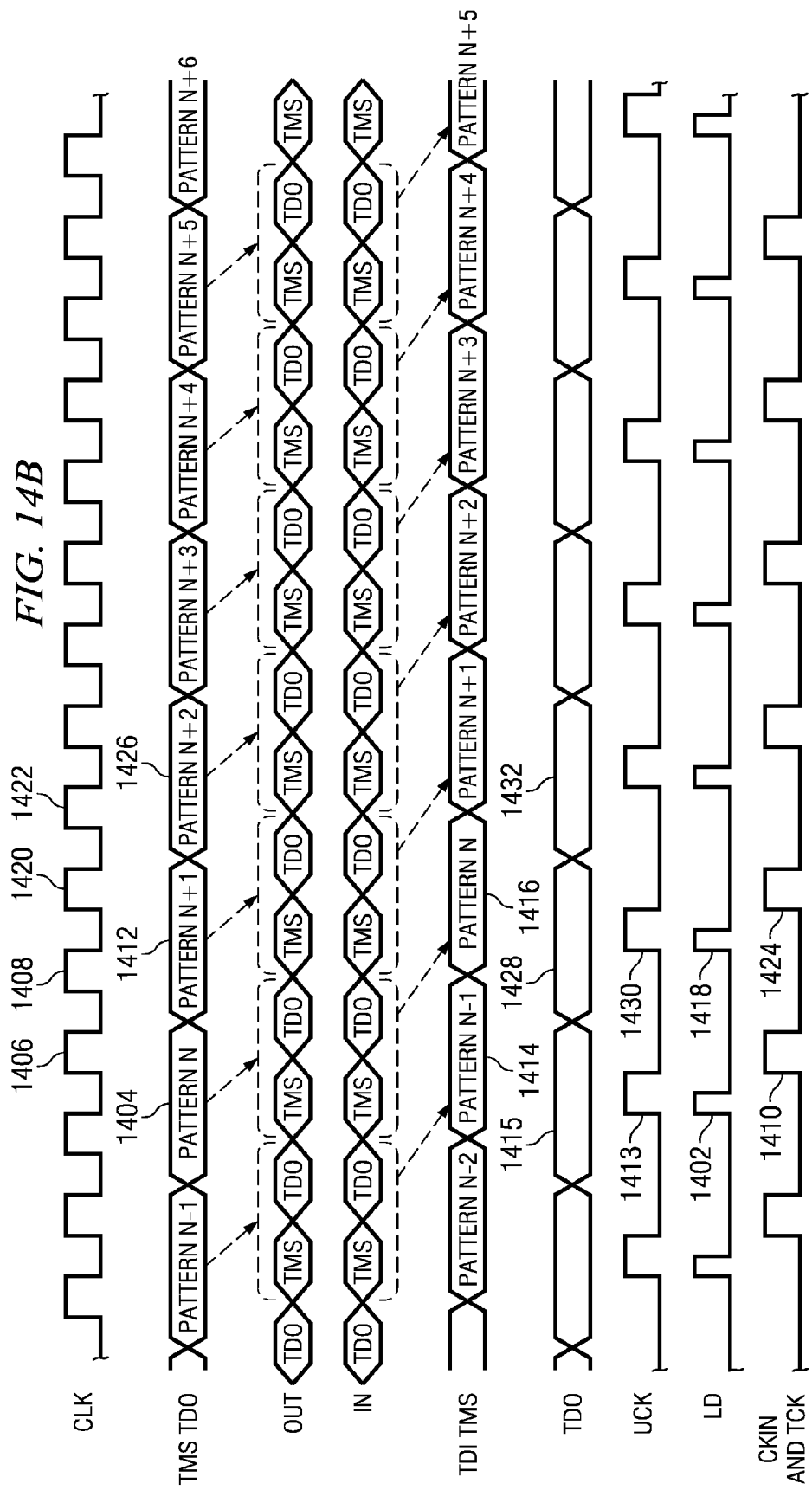

US 7,669,099 B2

OPTIMIZED JTAG INTERFACE

CROSS-REFERENCE TO RELATED APPLICATIONS

This application is a divisional of application Ser. No. 11/370,017, filed Mar. 7, 2006 now U.S. Pat. No. 7,421,633; And this application claims priority from Provisional Application No. 60/663,953, filed Mar. 21, 2005, and is related to the following patent applications or patents:

Application Ser. No. 11/292,643, "Reduced Signal Interface Method and Apparatus", now U.S. Pat. No. 7,308,629, issued Dec. 11, 2007; application Ser. No. 11/293,061, "Selectable Pin Count JTAG", now U.S. Pat. No. 7,328,387, issued Feb. 5, 2008; application Ser. No. 11/258,315, "2 Pin Bus", U.S. Pat. No. 6,073,254 "Selectively Accessing IEEE 1149.1 Taps in a Multiple Tap Environment"; and application Ser. No. 11/292,597, "Multiple Test Access Port Protocols Sharing Common Signals", now pending.

BACKGROUND OF THE DISCLOSURE

This disclosure relates in general to IC signal interfaces and in particular to IC signal interfaces related to test, emulation, debug, and trace operations.

DESCRIPTION OF THE RELATED ART

FIG. 1 illustrates a conventional 5 wire JTAG interface 106 between an external JTAG controller 100 and Tap Domains 104 within a target IC 102. Modern day ICs typically have a Tap Domain associated with the IC's JTAG boundary scan test operations and/or one or more Tap Domains associated with each one or more core circuits designed into the IC. The interface couples the TDO output of JTAG controller to the IC's TDI pin input, the TMS output of the JTAG controller to the IC's TMS pin input, the TCK output of the JTAG controller to the IC's TCK pin input, the TDI input of the JTAG controller to the IC's TDO pin output, and the TRST output of the JTAG controller to the IC's TRST pin input. The IC's TDI, TDO, TMS, TCK, and TRST pins 108 are dedicated for interfacing to the JTAG controller and cannot be used functionally.

In response to the TMS and TCK signals, the Tap Domains 104 of IC 102 communicates data to and from the JTAG controller via the TDO to TDI connections. A low output on the JTAG controller's TRST output causes the Tap Domains of IC 102 to enter a reset state. The JTAG controller receives a clock input (CKIN) from a clock source 110. The CKIN input times the operation of the JTAG controller, which in turn times the operation of the Tap Domains in IC 102. The JTAG controller can be used to perform test, emulation, debug, and trace operations in the target IC by accessing the embedded Tap Domains via the 5 wire interface. The arrangement between the JTAG controller and the target IC and its use in performing test, emulation, debug, and trace operations is well known in the industry.

FIG. 2 illustrates an alternate arrangement whereby a JTAG controller 200 is interfaced to a target IC 202 via the JTAG bus 108 and a Debug/Trace bus 204. The JTAG controller 200 differs from the JTAG controller of FIG. 1 in that it includes additional circuitry and input/outputs for interfacing to the IC's Debug/Trace circuitry 204. As in FIG. 1, the JTAG bus 108 is coupled to Tap Domains 104 within the IC via IC pins 108. The Debug/Trace bus 204 is coupled to Debug/Trace circuitry 206 within the IC via N IC pins 208.

The JTAG bus is used to input commands and data that enable the Debug/Trace circuitry to perform debug and/or trace operations. The Debug/Trace bus signals can be used for a myriad of operations including but not limited to; (1) importing and/or exporting data between the JTAG controller 200 and Debug/Trace circuitry 206 during debug and/or trace operations, (2) operating as a communications bus between the JTAG controller 200 and Debug/Trace circuitry 206, and (3) inputting and/or outputting trigger signals between the JTAG controller 200 and Debug/Trace circuitry 206 during debug and trace operations.

One of the key advantages of the debug/trace bus 204 is that it increases the data input/output bandwidth between the JTAG controller and target IC during debug/trace operation over what is possible using only the 5 wire JTAG bus 106. For example, the data input/output bandwidth of the JTAG bus is limited to the amount of data that can flow between the JTAG controller and IC over the single TDO to TDI signal wire connections. Since the debug/trace bus can have N signal wire connections between the JTAG controller and IC (N), its data bandwidth can be much greater than the JTAG bus bandwidth. Increased data bandwidth between the JTAG controller and IC facilitates debug/trace operations such as; (1) monitoring real time code execution, (2) accessing embedded memories, (3) uploading/downloading code during program debug, and (4) triggered output trace functions.

With the current trend towards smaller IC packaging to allow more ICs to be placed on smaller assemblies used in mobile applications, such as cell phones and personal digital assistants, the number of IC pins is being reduced. It is therefore a benefit of the present disclosure to provide a reduced pin count interface on ICs for test, emulation, debug, and trace operations, as this will allow more IC pins to be available for functional purposes. While it is advantageous to reduce the pin counts of both the JTAG and Debug/Trace buses of FIGS. 1 and 2, this application focuses on reducing the JTAG bus pins of an IC.

In addition to reducing the JTAG bus pins of an IC, a second benefit of the present disclosure is to maintain a high communication bandwidth over the reduced JTAG pins. As will be shown, the present disclosure provides a data communication bandwidth using the reduced JTAG pins that is equal to one half the data communication bandwidth using a full set of JTAG pins. For example, if the JTAG controller 100 can communicate data to and from Tap Domains 104 of FIG. 1 at 100 Mhz using the full JTAG bus 106, a JTAG controller adapted according to the present disclosure can communicate data to and from Tap Domains 104 of an IC, also adapted according to the present disclosure at 50 Mhz.

One prior art technique, referenced herein, is called the J-Link System. The J-Link system provides a way to reduce the JTAG pins of an IC from the standard five pins to a reduced set of one or two pins. In a chart shown in the J-Link reference, it is seen that the J-Link interface provides a data communication bandwidth that is one sixth that of the conventional JTAG 5 pin interface. For example and as stated in the J-Link reference, if the standard 5 pin JTAG interface can operate at 48 Mhz, the J-Link interface operates at one sixth of the 48 Mhz frequency, or at 8 Mhz. In comparison and as will be shown herein, if the standard 5 pin JTAG interface can operate at 48 Mhz, the reduce pin approach of the present disclosure can operate at one half the 48 Mhz frequency, of at 24 Mhz. Thus the present disclosure provides a three times improvement in operating frequency over the referenced J-Link approach. The present disclosure is therefore capable of performing operations related to IC test, debug, emulation, and trace at three times the bandwidth of the referenced J-Link approach.

SUMMARY OF THE DISCLOSURE

The present disclosure provides a reduced pin interface for JTAG based test, emulation, debug, and trace transactions between a JTAG controller and a target IC.

DESCRIPTION OF THE VIEWS OF THE DRAWINGS

FIG. 9C illustrates a timing diagram of the operation of the MRS circuit of FIG. 9A.

FIG. 13A illustrates an example circuit for determining the appropriate TDI or IN signal output of the I/O circuits of FIG. 11.

FIG. 13B illustrates the truth table used for determining the appropriate TDI or IN signal output based on the voltage level of the data I/O (DIO) signal.

FIG. 14A illustrates the 2 signal connection between the PSC of the JTAG controller and the SPC of the target IC according to the present disclosure.

FIG. 14B illustrates a timing diagram of the operation of the PSC and SPC circuits of FIG. 14A performing JTAG transactions between the JTAG controller and the Tap Domains of the target IC.

DETAILED DESCRIPTION

Figure 3:
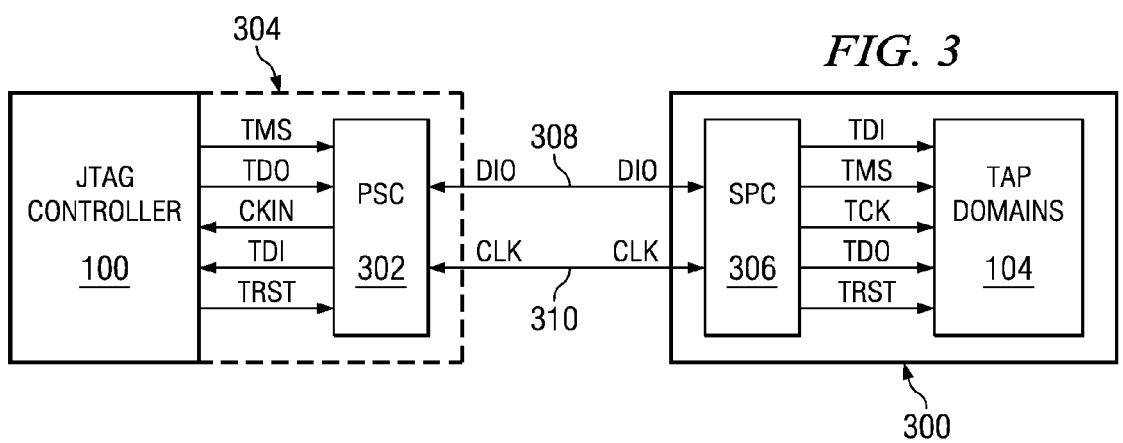
FIG. 3 illustrates a JTAG controller interfaced to a target IC via a 2 signal JTAG bus according to the present disclosure.

FIG. 3 illustrates the approach of the present disclosure to reduce the number of JTAG pins on an IC 300 and the number of JTAG bus signal connections between the IC 300 and JTAG controller 100. IC 300 and others illustrated in this disclosure could represent any type of integrated circuit including but not limited to, a microcontroller IC, a microprocessor IC, a digital signal processor IC, a mixed signal IC, an FPGA/ CPLD IC, an ASIC, a system on chip IC, a peripheral IC, a ROM memory IC, or a RAM memory IC. In FIG. 3, the JTAG controller 100 is interfaced to a Parallel to Serial Controller (PSC) circuit 302 via TDO, TMS, CKIN, TDI, and TRST signals. The PSC 302 may be a separate circuit from the JTAG controller 100 or the PSC 302 and JTAG controller 100 may be integrated to form a new JTAG controller 304. The PSC 302 is interfaced to a Serial to Parallel Controller (SPC) circuit 306 in IC 300 via a bus comprising a data I/O (DIO) signal 308 and a clock (CLK) signal 310. The SPC 306 is interfaced to Tap Domains 104 in the IC 300 via TDI, TMS, TCK, TDO, and TRST signals. As will be described later in regard to FIGS. 16-20, the CLK signal 310 may be driven by a clock source associated with the JTAG controller 100, a clock source associated with the IC 300, or a clock source not associated with the JTAG controller 100 or IC 300.

Figure 4A:
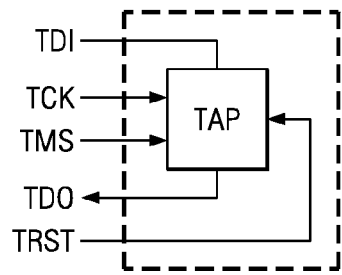
FIGS. 4A-4C illustrate various conventional Tap Domain arrangements within a target IC.

FIG. 4A illustrates that the Tap Domain block 104 of IC 300 may consist of a single 1149.1 Tap architecture.

Figure 4B:
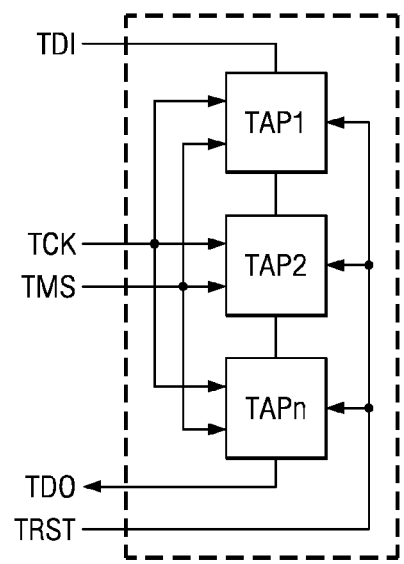

FIG. 4B illustrates that the Tap Domain block 104 of IC 300 may consist of a series of daisy-chained Tap architectures 1-N.

Figure 4C:
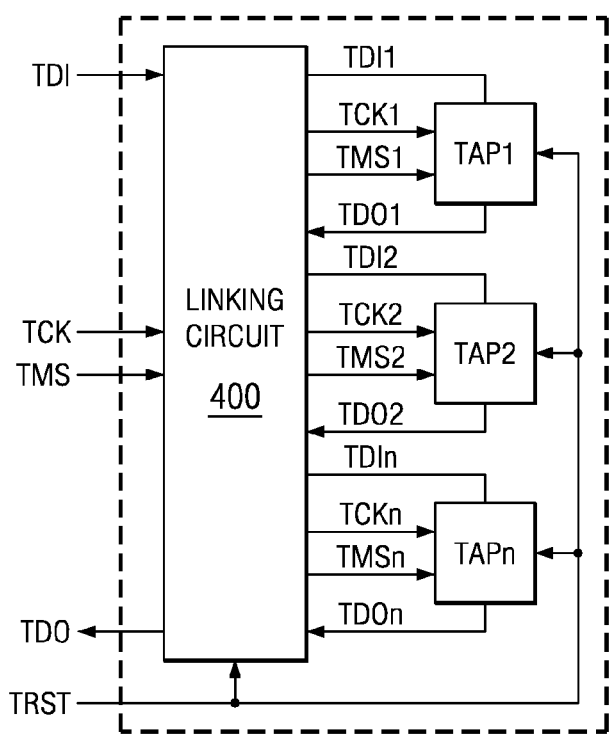

FIG. 4C illustrates that the Tap Domain block 104 of IC 300 may consist of a group of Tap architectures 1-N that may be selected individually or linked serially together in various daisy-chain arrangements using linking circuitry 400. An example of such linking circuitry 400 has been described in referenced U.S. Pat. No. 6,073,254.

Figure 5A:
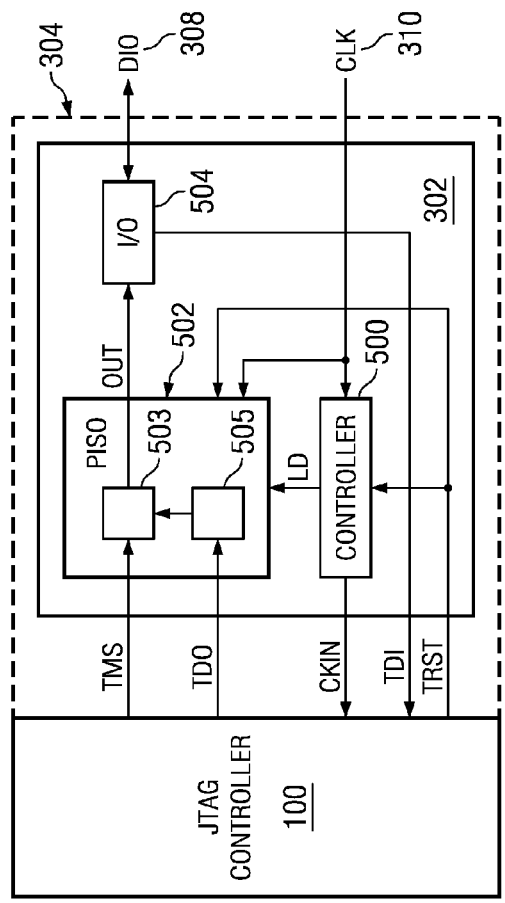
FIG. 5A illustrates a circuit example of the parallel to serial controller (PSC) circuit of the present disclosure.

FIG. 5A illustrates the PSC circuit 302 in more detail. The PSC consists of a controller 500, a parallel input serial output (PISO) register 502, and an input/output (I/O) circuit 504. PISO 502 inputs parallel TMS and TDO signals from the JTAG controller 100, the TRST signal from the JTAG controller 100, a load (LD) signal from controller 500, and outputs a serial output (OUT) signal to I/O circuit 504.

A simplified view of PISO 502 shows it containing two serially connected FFs 503 and 505. While the TRST signal from the JTAG controller is low, FFS 503 and 505 are asynchronously set to logic ones and do not respond to the CLK or LD inputs. This can be achieved, for example, by connecting the TRST signal to the Set input of FFs 503 and 505. The OUT signal is therefore high while TRST is low. When TRST goes high FFS 503 and 505 are enabled to respond to the CLK and LD inputs. In response to the LD input, FFs 503 and 505 asynchronously load TMS and TDO output from the JTAG controller, respectively. Once loaded, the FFs are shifted by CLK 310 to output TMS then TDO signals to I/O circuit 504 via the OUT signal.

Controller 500 inputs the CLK signal 310, the TRST signal from the JTAG controller 100. Controller 500 outputs the asynchronous LD signal to the PISO and a clock signal to the CKIN input of JTAG controller 100. While TRST is low, the controller is reset and does not respond to the CLK input. While reset the LD and CKIN outputs from the controller are low. When TRST goes high, the controller is enabled to respond to the CLK input and output LD and CKIN output signals.

I/O circuit 504 inputs the OUT signals from the PISO and outputs them on DIO 308. The I/O circuit 504 also inputs signals from DIO 308 and outputs them to the TDI input of JTAG controller 100. I/O circuit 504 is designed to allow the output of OUT signals to DIO 308 and the input of TDI signals from DIO 308 to occur simultaneously. The simultaneous input and output operation of I/O circuit 504 will be described in detail later in regard to FIGS. 11A, 11B, 12, 13A, and 13B.

Figure 5B:
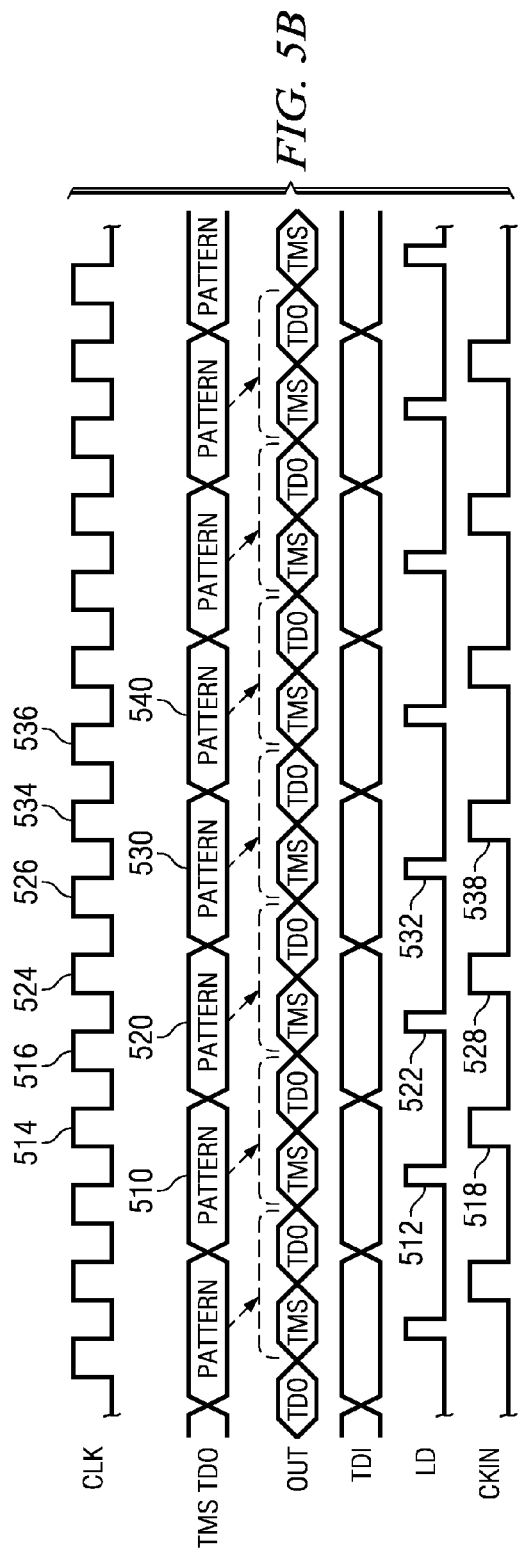
FIG. 5B illustrates a timing diagram of the operation of the PSC circuit of FIG. 5A.

The operation of PSC 302 (while TRST is high) is illustrated in the timing diagram of FIG. 5B. In response to the CLK input 310, the controller 500 operates to periodically output the LD signal to PISO 502 and the CKIN signal to JTAG controller 100. Also the CLK input 310 times the PISO 502 to shift data from its OUT output to the I/O circuit 504. The I/O circuit passes the OUT signal to the DIO 308 signal. The CKIN signal times the operation of the JTAG controller 100. The LD signal causes the PISO to asynchronously load the TMS and TDO signal pattern from JTAG controller 100. Once loaded, the TMS and TDO pattern is shifted out of the PISO to the I/O circuit in response to the CLK signal.

The following describes the PSC's repeating load and shift out sequence. A TMS and TDO pattern 510 is asynchronously loaded into the PISO in response to LD signal 512. CLK signal 514 shifts out the TMS signal portion of pattern 510 on the OUT output of the PISO, then CLK signal 516 shifts out the TDO signal portion of pattern 510 on the OUT output of the PISO. CKIN signal 518 advances the JTAG controller to output the next TMS and TDO pattern 520. LD signal 522 asynchronously loads the next TMS and TDO pattern 520 into the PISO. CLK signal 524 shifts out the TMS signal portion of pattern 520 on the OUT output of the PISO, then CLK signal 526 shifts out the TDO signal portion of pattern 520 on the OUT output of the PISO. CKIN signal 528 advances the JTAG controller to output the next TMS and TDO pattern 530 which is asynchronously loaded into the PISO by LD signal 532 and shifted out by CLK signals 534 and 536. The JTAG controller is advanced to output the next TMS and TDO pattern 540 during CKIN 538. The above described pattern load, pattern shift, and JTAG controller advancement process repeats as long as the CLK input 310 is active.

When the JTAG controller 100 receives a CKIN input it will output a new TMS and TDO signal pattern to PISO 502 and input the TDI signal from I/O circuit 504. The TMS signal output will control the Tap state machine of the target IC's Tap Domain 104 according to FIG. 10, the TDO signal will provide the TDI input signal to the target IC's Tap Domain (if in the Shift-DR/IR state), and the TDI input signal will input data to the JTAG controller from the target IC's Tap Domain (if in the Shift-DR/IR state).

Figure 6A:
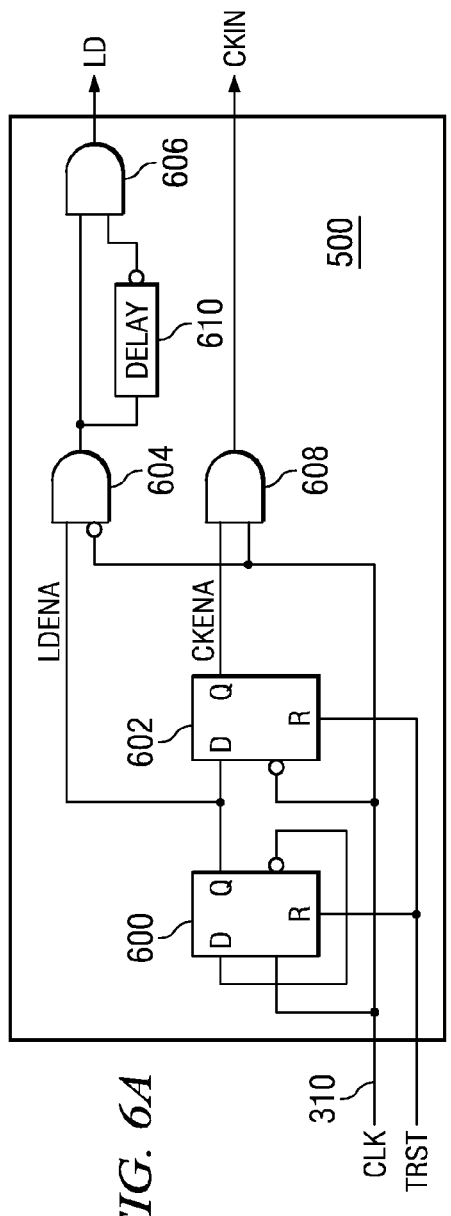
FIG. 6A illustrates a circuit example of the controller within the PSC circuit of FIG. 5A.

FIG. 6A illustrates an example implementation of controller 500. Controller 500 consists of FF 600, FF 602, AND gates 604-608, and delay inverter 610. While the TRST input from the JTAG controller 100 is low, FFs 600 and 602 are reset and the LD and CKIN outputs are low. When TRST goes high, FFs 600 and 602 are enabled to respond to the CLK input 310. FF 600 toggles its load enable (LDENA) output during each rising edge of CLK input 310. FF 602 stores the LDENA output of FF 600 at its clock enable (CKENA) output on each falling edge of CLK input 310. AND gate 604 outputs a high when LDENA is high and CLK is low. AND Gate 606 and delay inverter 620 operate together to produce a high going pulse on the LD output whenever the output of AND gate 604 goes high.

The duration of the high going pulse on the LD signal is determined by the input to output signal delay through delay inverter 610. The duration of the LD pulse should be long enough to asynchronously load the PISO with the TMS and TDO pattern but not long enough to interfere with the shifting operation of the PISO. For example, the high going LD pulse should return low for a sufficient amount of time prior to the next rising edge of the shifting CLK input so as to not interfere with the shift operation. The CKENA output of FF 602 enables AND gate 608 to pass the CLK signal 310 to the CKIN output. CKENA changes state on the falling edge of CLK 310 to allow a AND gate 608 to be enabled prior to the rising edge of CLK 310 to allow for good clock gating operation at the CKIN output.

Figure 6B:
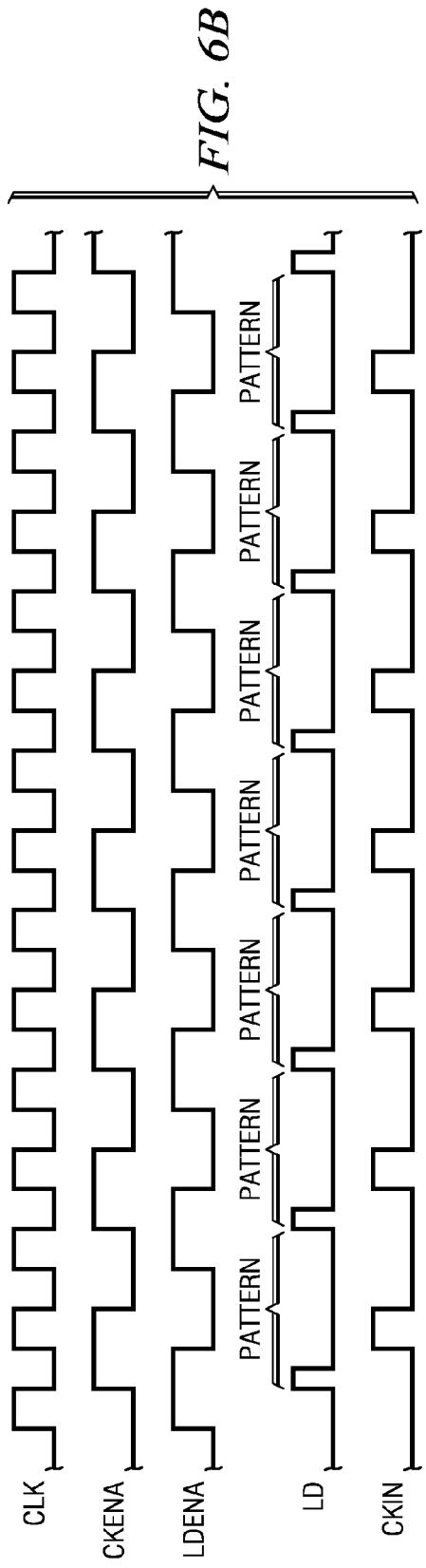
FIG. 6B illustrates a timing diagram of the operation of the controller of FIG. 6A.

The operation of controller 500 is illustrated in the timing diagram of FIG. 6B. In response to the CLK input 310, the controller 500 operates to periodically output the LD and CKIN signals. As mentioned, the CKIN signal times the operation of the JTAG controller 100 and the LD signal causes the PISO to asynchronously load the TMS and TDO pattern from the JTAG controller 100. On each rising edge of CLK 310 the LDENA output of FF 600 toggles its state. On each falling edge of CLK 310 the CKENA output of FF 602 is set to the state of the LDENA input to FF 602. A LD pulse output occurs each time LDENA is high and the CLK goes low. A CKIN output occurs each time CKENA is high and the CLK is high.

Figure 7A:
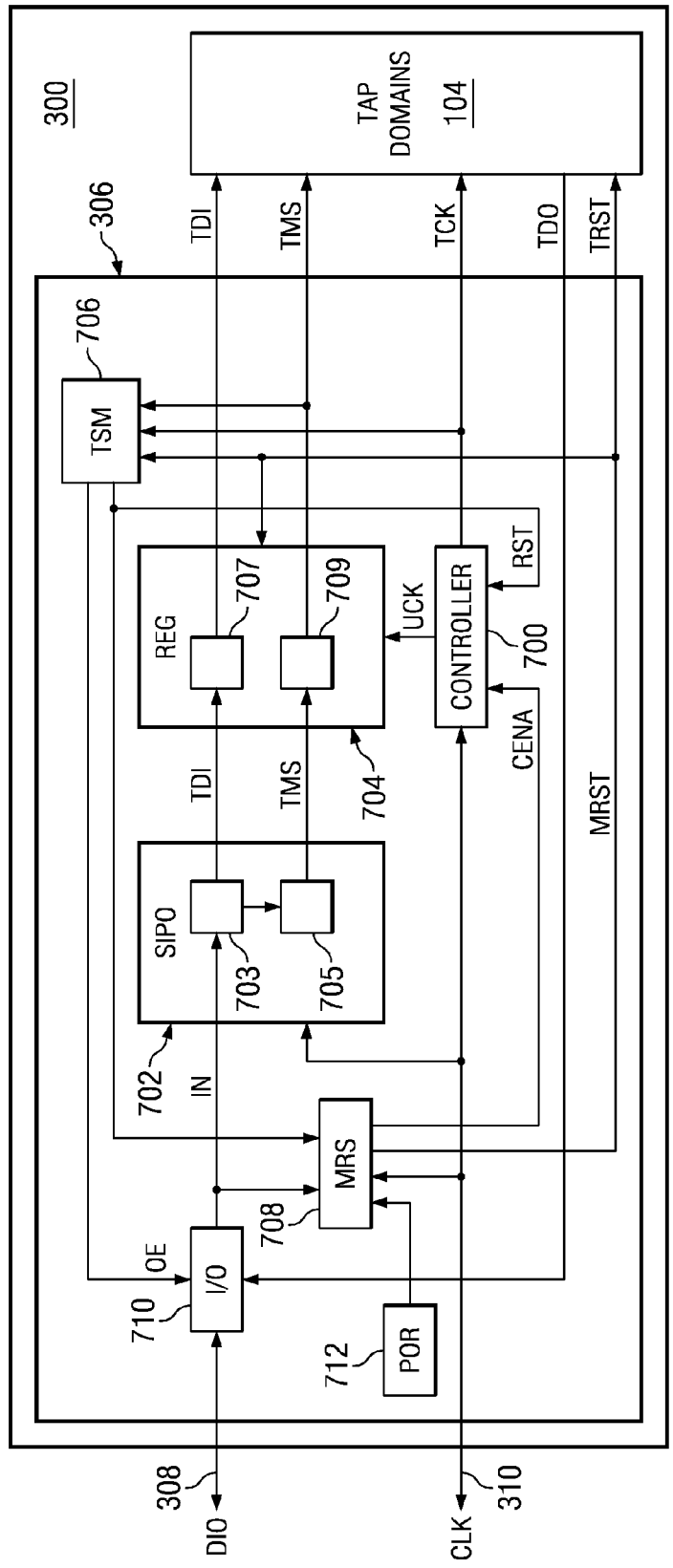
FIG. 7A illustrates a circuit example of the serial to parallel controller (SPC) circuit of the present disclosure.

FIG. 7A illustrates the SPC circuit 306 in more detail. The PSC consists of a controller 700, a serial input parallel output (SIPO) register 702, update register 704, Tap state machine (TSM) 706, master reset and synchronizer (MRS) circuit 708, input/output (I/O) circuit 710, and power on reset circuit (POR) 712.

POR circuit 712 produces a temporary low active power on reset pulse whenever the target IC is first power up. This power on reset pulse is used to initialize the MRS circuit. When initialized, the MRS circuit 708 outputs a low on the master reset (MRST) signal to initialize other circuitry within the SPC 306 and to set TRST input of the connected Tap Domains 104 low. When TRST is low, the Tap Domains 104 are forced to the Test Logic Reset state. The Test Logic Reset state is a state of the 1149.1 Tap state machine and is shown in the Tap state machine diagram of FIG. 10. The POR circuit 712 may exist in the SPC 306 as shown or it may exist external to the SPC, i.e. as a separate circuit within the target IC. The function of the POR circuit to initialize the MRS circuit 708 may be achieved by other means. For example a reset pin of the IC may be substituted for the POR circuit 712 and used to initialize the MRS circuit 708.

Controller 700 inputs the CLK signal 310, a controller enable (CENA) signal from MRS 708, a reset (RST) signal from TSM 706. The controller outputs an update clock (UCK) to update register 704 and a TCK signal to Tap Domains 104 and TSM 706. A detail description of controller 700 will be given in FIGS. 8A and 8B.

I/O circuit 710 inputs an output enable (OE) signal from TSM 706. The OE signal is used to enabled or disable the output drive of I/O circuit 710. I/O circuit 710 inputs signals from DIO 308 and outputs them to SIPO 702 via the IN signal. If the OE is set to enable the output drive of I/O circuit 710, TDO signals input from Tap Domains 104 are output on DIO. If the OE is set to disable the output drive of I/O circuit 710, TDO signals are not output on DIO and the I/O circuit operates to only input DIO signals to SIPO 702 via the IN signal. I/O circuit 504 is designed to allow the output of TDO signals to DIO 308, if enabled by OE, and the input of IN signals from DIO 308 to occur simultaneously. The simultaneous input and output operation of I/O circuit 710 will be described in detail later in regard to FIGS. 11A, 11B, 12, 13A, and 13B.

SIPO 702 inputs the serialized TMS and TDO signal patterns from the IN output of I/O circuit 710 in response to the CLK input 310 and outputs them to update register 704. The update register 704 inputs the TDO and TMS outputs from the SIPO and outputs them as TDI and TMS signals to Tap Domains 104. The update register also inputs the MRST signal from the MRS circuit 708. While the MRST signal is active low the TDO and TMS outputs of the update register 704 are set high. While the MRST signal is inactive high the update register can respond to the update clock (UCK) signal from controller 700 to load TDO and TMS signals from the SIPO 702.

A more detail view of SIPO 702 and update register 704 shows the SIPO containing two serially connected FFs 703 and 705. In response to the CLK signal 310, FFs 703 and 705 shift in the serialized TMS and TDO signals from the IN output of I/O circuit 710. Once the TMS and TDO signals are shifted in they are transferred in parallel to FFs 707 and 709 in the update register 704 in response to the UCK signal where they are input to the TDI and TMS inputs of Tap Domains 104. The update register serves to provide the current TDI and TMS input pattern to the Tap Domains 104 while the SIPO operates to serially input the next TDO and TMS pattern to be input to the Tap Domains 104. As mentioned, the outputs of FFs 707 and 709 are asynchronously forced high in response to a low on the MRS signal, which results in highs being input to the TDI and TMS inputs of Tap Domain 104. This can be achieved, for example, by connecting the MRS signal to the Set input of FFs 707 and 709.

TSM circuit 706 inputs the TMS output from the update register, the TCK output of controller 700, and the MRST output from MRS circuit 708. TSM circuit 706 outputs a reset (RST) signal to controller 700 and MRS circuit 708, and the OE signal to I/O circuit 710. The TSM is simply the Tap state machine defined in IEEE standard 1149.1. The MRST input from MRS circuit 708 is connected to the standard "TRST" input of 1149.1 TSM, the TCK input from controller 700 is connected to the standard "TCK" input of the 1149.1 TSM, the TMS input from controller 700 is connected to the standard "TMS" input of the 1149.1 TSM, the RST output from TSM is connected to the standard "Reset*" output of the 1149.1 TSM, and the OE output of the TSM is connected to the standard "Enable" output of the 1149.1 TSM.

The TSM circuit is used by the present disclosure to allow the SPC to track the Tap states of the connected Tap Domains, especially the states that control the OE and RST outputs. The operation of the 1149.1 Tap state machine is defined in the 16 states shown in FIG. 10. While it is possible to actually use signals from the Tap state machine(s) of the connected Tap Domains 104 for tracking, instead of implementing a dedicated TSM circuit 706 in the SPC 306, the required signals (OE and RST) may not always be available from the Tap Domains 104. For example, connected Tap Domains 104 of hard cores (i.e. cores that are fixed and cannot be modified) may not provide OE and RST output signal terminals for connection to the SPC's OE and RST terminals. Further, Tap Domains 104 having linking arrangements as shown in FIG. 4C may present OE and RST signal switching complexities between the SPC 306 and linked Taps within Tap Domains 104. Therefore, the SPC 306 preferably includes a TSM circuit 706 to insure simplicity in tracking the states of connected Tap Domains 104.

MRS circuit 708 inputs the IN output of I/O circuit 710, the CLK signal 310, the RST signal from TSM 706, and the power on reset output of POR circuit 712. MRS circuit 708 outputs the MRST signal to Tap Domains 104, TSM 706, and update register 704 and the CENA signal to controller 700. The purposes of the MRS circuit 708 are; (1) to maintain the SPC and connected Tap Domains 104 in a reset state when the target IC is operating normally in a system with no JTAG controller 100 and PSC 302 connected to the SPC's DIO 308 and CLK 310 signals, and (2) to allow synchronizing the operation of the SPC 306 to the operation of a JTAG controller 100 and PSC 302 when the JTAG controller and PSC are connected to the SPC's DIO and CLK signals. Synchronizing the operation of the SPC to the operation of the JTAG controller and PSC is important since it allows the serialized TMS and TDO patterns output from PSC to be correctly input as serialized TMS and TDO patterns to the SPC. A detail description of MRS circuit 708 will be given in regard to FIGS. 9A-9C.

Figure 7B:
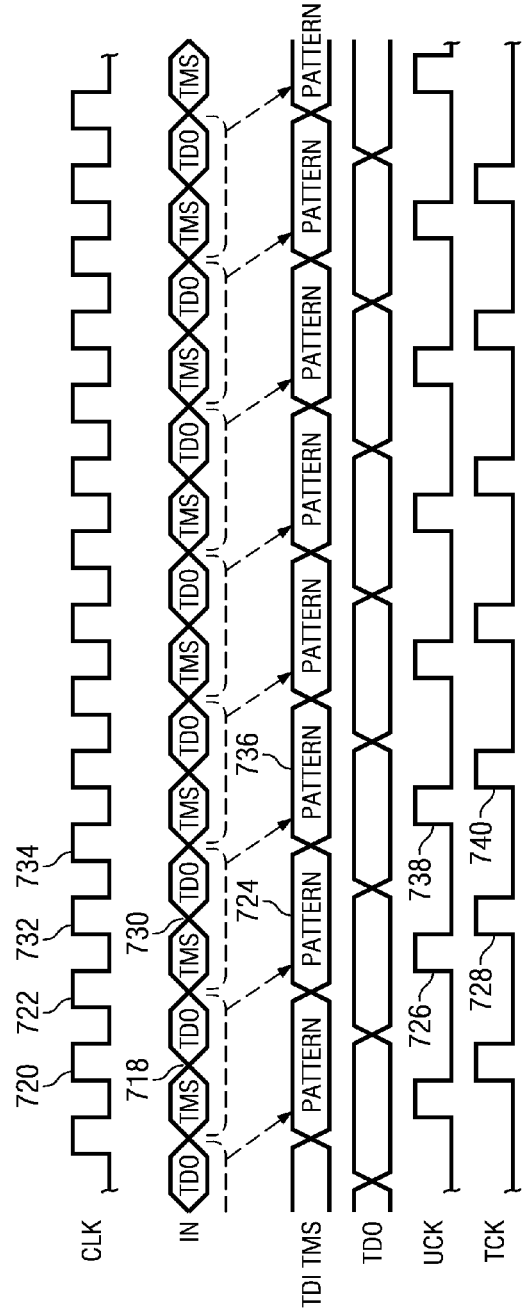
FIG. 7B illustrates a timing diagram of the operation of the SPC circuit of FIG. 7A.

The operation of SPC 306 is illustrated in the timing diagram of FIG. 7B. In response to the CLK input 310, the controller 700 operates to periodically output the UCK signal to the update register 704 and the TCK signal to Tap Domains 104 and TSM 706. Also the CLK input 310 times the SIPO 702 to shift in data from the IN output of the I/O circuit 710. The I/O circuit passes DIO input signals to the IN output. The TCK signal times the operation of the Tap Domains 104. The UCK signal causes the update register 704 to load the parallel TDO and TMS signal pattern output of the SIPO 702. Once loaded, the TDO and TMS signal pattern is applied to the TDI and TMS inputs of Tap Domains 104. The Tap Domains 104 respond to the TDI and TMS signal pattern in response to the TCK.

The following describes the SPC's repeating shift in and update sequence. A serial TMS and TDO bit stream 718 is shifted into SIPO 702 in response to CLK signals 720 and 722. The shifted in TMS and TDO signals form a parallel TDO and TMS output pattern 724 from SIPO 702 that is clocked into to the update register 704 in response to UCK signal 726. The TDO and TMS pattern 724 in the update register 704 is applied to the TDI and TMS inputs of Tap Domains 104. TCK signal 728 clocks the Tap Domains 104 to respond to the TDI and TMS pattern 724 from update register 704. The next serial TMS and TDO bit stream 730 is shifted into SIPO 702 in response to CLK signals 732 and 734. The shifted in TMS and TDO signals form a parallel TDO and TMS output pattern 736 from SIPO 702 that is clocked into to the update register 704 in response to UCK signal 738. The TDO and TMS pattern 738 in the update register 704 is applied to the TDI and TMS inputs of Tap Domains 104. TCK signal 740 clocks the Tap Domains 104 to respond to the TDI and TMS pattern 730 from update register 704. The above described serial pattern shift in, parallel pattern update, and Tap Domain clock operation repeats as long as the CLK input 310 is active.

Figure 10:
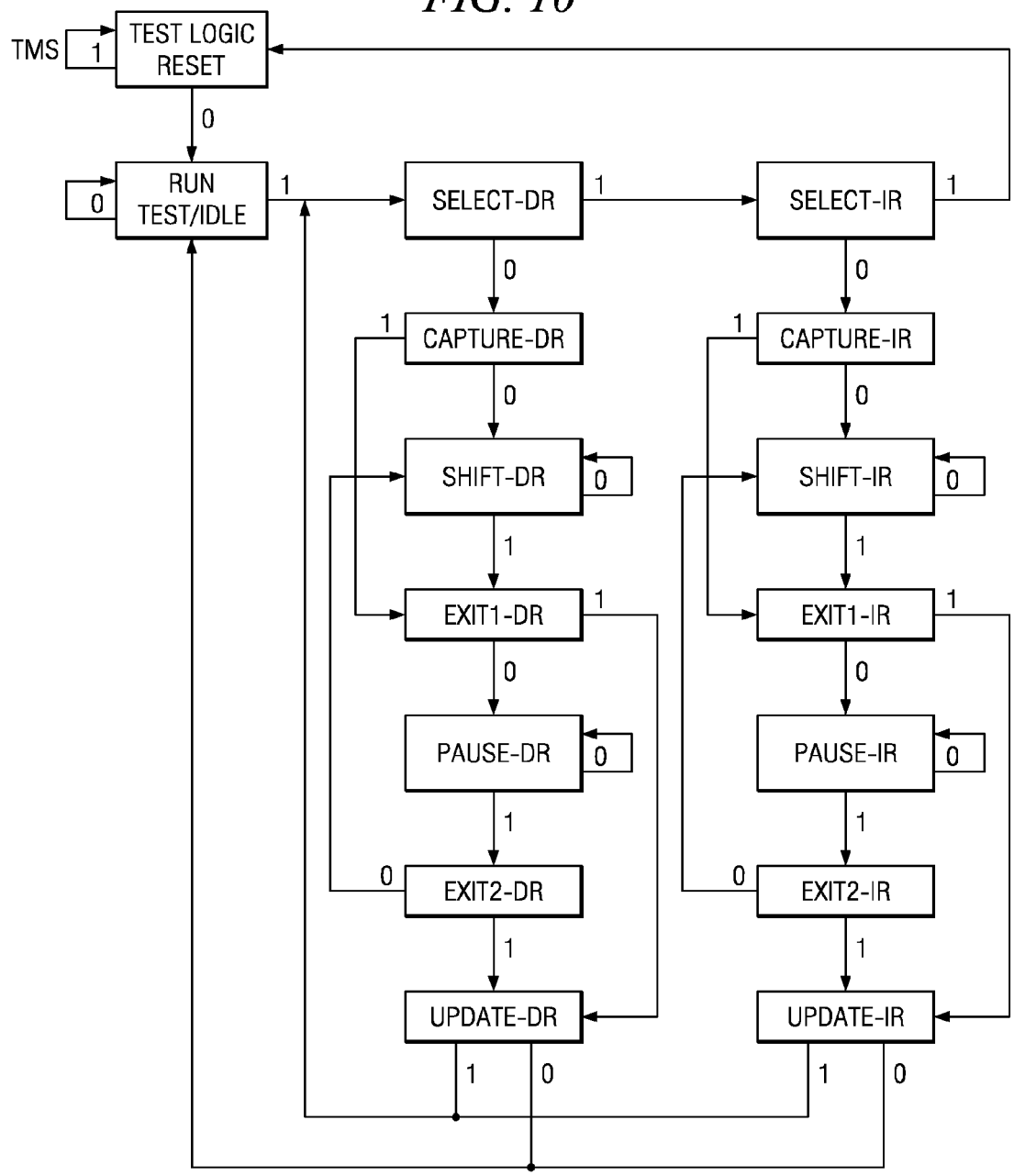
FIG. 10 illustrates the state diagram of the IEEE standard 1149.1 Tap controller state machine.

When the Tap Domain 104 receives a TCK input, the Tap state machine of the Tap Domain responds to the TMS input to perform state transitions as seen in FIG. 10. Also the Tap Domain 104 will input data from its TDI input and output data on its TDO output in response to a TCK input, if the Tap state machine is in the Shift-DR/IR state of FIG. 10.

Figure 8A:
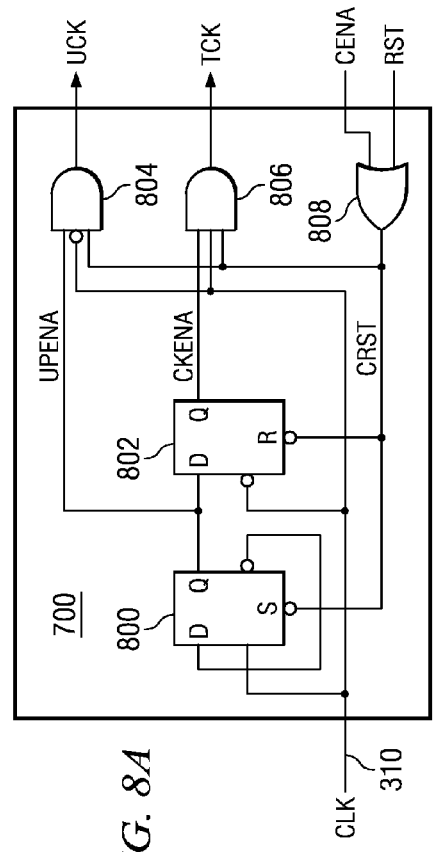
FIG. 8A illustrates a circuit example of the controller within the SPC circuit of FIG. 7A.

FIG. 8A illustrates an example implementation of controller 700. Controller 700 consists of FF 800, FF 802, AND gates 804 and 806, and OR gate 808. FF 800 toggles its update enable (UPENA) output during each rising edge of CLK 310. FF 802 stores the UPENA output of FF 800 at its clock enable (CKENA) output on each falling edge of CLK 310. AND gate 804 outputs a high on its UCK output when UPENA is high, CLK is low, and the controller reset (CRST) output of OR gate 808 is high. AND gate 806 is gated on to pass its CLK 310 input to its TCK output whenever CKENA and CRST are high, otherwise the TCK output is forced low. OR gate 808 outputs a high on CRST whenever the CENA input from CS circuit 708 is high and/or the RST input from TSM 706 is high, otherwise CRST outputs a low. CKENA changes state on the falling edge of CLK 310 to allow AND gate 806 to be enabled prior to the rising edge of CLK 310 to allow for good clock gating operation at the TCK output.

Figure 8B:
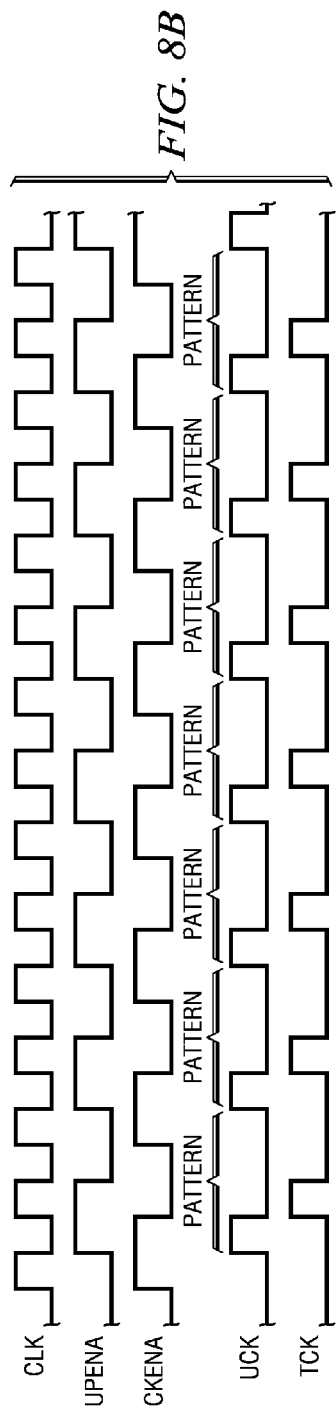
FIG. 8B illustrates a timing diagram of the operation of the controller of FIG. 8A.

The operation of controller 700 is illustrated in the timing diagram of FIG. 8B. While the CRST output of OR gate 808 is high, the controller 700 operates to periodically output the UCK and TCK signals in response to the CLK input 310. As mentioned, the TCK signal times the operation of the Tap Domains 104 and the UCK signal causes the update register to load the parallel TDO and TMS pattern from SIPO 702. On each rising edge of CLK 310 the update enable (UPENA) output of FF 800 toggles its state. On each falling edge of CLK 310 the CKENA output of FF 802 is set to the state of the UPENA input to FF 802. An UCK output occurs each time LDENA is high and the CLK goes low. A CKIN output occurs each time CKENA is high and the CLK is high. If CENA and RST are both low, the CRST output of OR gate 808 will be low to reset controller 700. While CRST is low, the UPENA output of FF 800 is set high, the CKENA output of FF 802 is set low, the UCK output of AND gate 804 is set low, and the TCK output of AND gate 806 is set low.

Figure 9B:
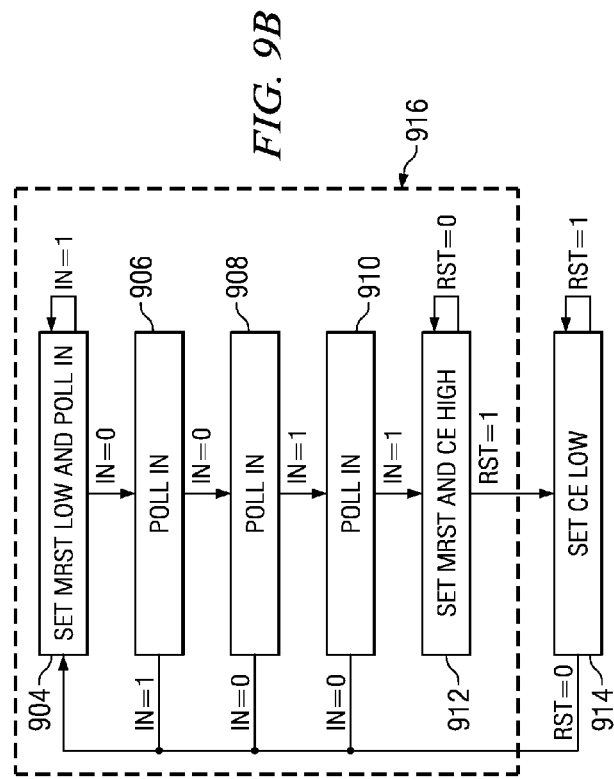
FIG. 9B illustrates a state diagram of the operation of the MRS circuit of FIG. 9A.
Figure 9A:
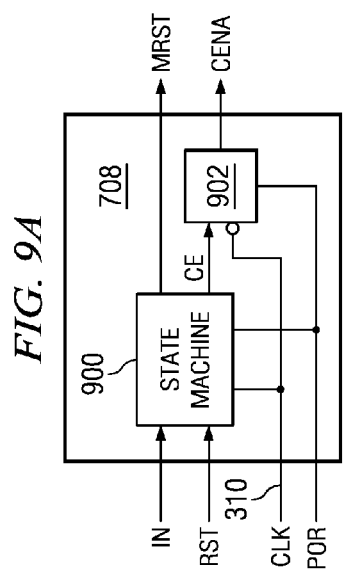
FIG. 9A illustrates a circuit example of the master reset and synchronizer (MRS) circuit within the SPC circuit of FIG. 7A.

FIG. 9A illustrates an example implementation of the MRS circuit 708. MRS circuit 708 consists of a state machine 900 and a FF 902. The state machine 900 operates on the rising edge of CLK 310 and FF 902 operates on the falling edge of CLK 310. The state machine 900 inputs the IN signal from I/O circuit 710, the RST signal from TSM 706, a clock signal from CLK 310, and a power on reset signal from POR 712. The state machine 900 outputs the previously mentioned MRST signal and a controller enable (CE) signal. The CE signal is connected to the D input of FF 902. The Q output of FF 902 drives the previously mentioned CENA signal. The reset input of the FF 902 is connected to the power on reset output of POR 712.

As previously mentioned the purposes of the MRS circuit 708 are to maintain the SPC and Tap Domains in a reset condition when the SPC's DIO 308 signal is not externally driven and to synchronize the operation of the SPC with an external circuit driving the SPC's DIO 308 signal.

The operation of state machine 900 is shown in the state diagram of FIG. 9B. In response to a low active power on reset input from POR 712 or in response to the RST output of TSM 706 going low, the state machine 900 will enter "Set MRST Low & Poll IN" state 904. In state 904 the state machine will output a low on the MRST output signal. The state machine will remain in state 904 while the IN input from I/O circuit 710 is high. The state machine will transition to "Poll IN" state 906 if the IN input goes low. The MRST output remains low in state 906. The state machine will return to state 904 from state 906 if the IN input goes high, otherwise the state machine will transition from state 906 to "Poll IN" state 908. The MRST output remains low in state 908. The state machine will return to state 904 from state 908 if the IN input goes low, otherwise the state machine will transition from state 908 to "Poll IN" state 910. The MRST output remains low in state 910. The state machine will return to state 904 from state 910 if the IN input goes low, otherwise the state machine will transition from state 910 to "Set MRST & CE High" state 912.

In state 912, the state machine sets the MRST and CE signals high. On the falling edge of CLK 310, FF 902 clocks in the high CE output from state machine 900 which sets the CENA output of FF 902 high. The state machine will remain in state 912 while the RST input is low. When the RST input goes high, the state machine will transition to the "Set CE Low" state 914. In state 914, the state machine sets the CE signal low. On the falling edge of CLK 310, FF 902 clocks in the low CE output from state machine 900 which sets the CENA output of FF 902 low. The state machine will remain in state 914 while the RST input is high and will transition to state 904 when the RST input goes low.

The state machine is designed to enter state 904 when it receives a power on reset input from POR 712 or a low input on the RST output of TSM 706. The state machine will remain in state 904 as long as the IN input from I/O circuit 710 is high. As will be described later in regard to FIG. 11A, I/O circuit is designed to output a high on the IN signal when the state machine outputs a low on the MRST signal and if the DIO input 308 to I/O circuit 710 is not being externally driven. The high on the IN signal maintains the state machine 900 in state 904 which maintains a low on the state machine MRST output. While MRST is low, SPC 306 circuitry and Tap Domains 104 are held in an inactive reset state that cannot interfere with the normal operation of the target IC.

When the JTAG controller 100 and PSC circuit 302 of FIG. 5A are first connected to the DIO signal of the target IC's SPC circuit 306 of FIG. 7A, the operation of the PSC and SPC circuits need to be synchronized such that the serialized TMS and TDO patterns from the PSC are correctly input as serialized TMS and TDO patterns to the SPC. The states within section 916 of the state diagram of FIG. 9B provide one example of how this required synchronization step may be achieved. A timing diagram depicting this synchronization process is shown in FIG. 9C.

Time reference 918 of FIG. 9C indicates a time period where the PSC 302 is not connected to SPC 306, i.e. DIO 308 is not being externally driven. The circuitry in the SPC 306 and Tap Domains 104 of the target IC have been initialized as previously described and the state machine 900 is in state 904 polling the high output of the IN signal and outputting a low on the MRST output. Time 918 could be a time where the target IC in which the SPC 306 and Tap Domains 104 reside is operating normally in a system and the SPC's DIO signal is not being externally driven to perform test, emulation, debug, and/or trace operations. In this timing example it is assumed that CLK signal 310 is being actively driven by a clock source within the target IC. Thus state machine 900 state 904 is polling the high logic level of the IN signal during each rising edge of the active CLK signal 310. It is worth noting that if the IN signal were to temporarily go low during a CLK cycle input for some unknown reason, the state machine would return to state 904 via state 906. Further, the state machine would return to state 904 from states 908 and 910 in response to the IN signal having other temporarily low and high signal sequences for some unknown reason.

Time reference 920 of FIG. 9C indicates a time period where the PSC 302 has been externally connected to the SPC 306 via the DIO 308 and CLK 310 signals. During the physical connection process there may be undesirable temporary signaling sequence on DIO 308 due to the electrical connection being formed between the PSC and SPC. These temporary signal sequences could prevent the successful synchronization between the PSC and SPC. The state transition mapping in section 916 of FIG. 9B is provided to filter out the following three types of temporary signal sequences on the DIO so that they do not affect the synchronization process between PSC and SPC.

(1) As seen in the state diagram, a temporary DIO signal sequence of 1-0-1 during the connection process would cause the state machine to transition from state 904 to state 906 and back to state 904. Thus this temporary DIO connection sequence is prevented from affecting the synchronization process.

(2) As seen in the state diagram, a temporary DIO signal sequence of 1-0-0-0-1 during the connection process would cause the state machine to transition from state 904 to state 906 to state 908 and back to state 904. Thus this temporary DIO connection sequence is prevented from affecting the synchronization process.

(3) As seen in the state diagram, a temporary DIO signal sequence of 1-0-0-1-0-1 during the connection process would cause the state machine to transition from state 904 to state 906 to state 908 to state 910 and back to state 904. Thus this temporary DIO connection sequence is prevented from affecting the synchronization process.

It should be understood that while the example state machine has been designed to filter out the above three types of temporary DIO sequences, it could be designed to filter out a greater number of DIO sequences if desired.

Time reference 922 of FIG. 9C indicates the start of a time period where the connection between the PSC 302 and SPC 306 has been made and the state machine is in state 904 with the IN signal driven high by DIO input from the connect PSC 302. The PSC 302 begins the synchronization process by serially inputting a pattern of two logic 0's 924 on the SPC's IN signal via DIO 308, which causes the state machine 900 to transition from state 904 to state 906 to state 908. As seen in FIG. 5A, the PSC outputs the two logic 0's by loading the PISO 502 with a TMS value of 0 and a TDO value of 0 using the LD signal, then shifting the PISO to output the two logic 0's using the CLK signal 310. Next the PSC 302 serially inputs a pattern of two logic 1's 926 on the SPC's IN signal via DIO 308, which causes the state machine 900 to transition from state 908 to state 910 to state 912. Again as seen in FIG. 5A, the PSC outputs the two logic 1's by loading the PISO 502 with a TMS value of 1 and a TDO value of 1 using the LD signal, then shifting the PISO to output the two logic 1's using the CLK signal 310. As seen, the state machine 900 can only transition from state 904 to state 912 in response to the exact input of a serial pattern of two logic 0's followed by a serial pattern of two logic 1's.

As seen in the timing diagram, the MRST and CE signal outputs of state machine 900 are set high in state 912 at time 925. MRST going high removes the reset condition from Tap Domains 104, TSM 706, and update register 704. CE going high causes FF 902 to set CENA high at time 927. When CENA goes high, the CRST signal of controller 700 is set high which enables the controller 700 to start outputting UCK and TCK signals at time 923. The first UCK signal at time 923 loads the two logic 1's of pattern 926 into update register 704. The enabling of the SPC's controller 700 at time 923 occurs such that the UCK and TCK signals of the SPC's controller 700 are synchronized with the LD and CKIN signals of the PSC's controller 500, respectively. By synchronizing the UCK signal with the LD signal and the TCK signal with the CKIN signal the SPC 306 can correctly receive subsequent serialized two bit patterns from PSC 302 via DIO 308. For example, when the PISO 502 is shifting out a two bit pattern the SIPO 702 is shifting in the two bit pattern, and when the PISO 502 is loading the next two bit pattern to be shifted the SIPO 702 is updating the current two bit pattern to the update register 704. The synchronized operation of the UCK and LD signals and the TCK and CKIN signals will be seen more clearly in regard to the description of FIG. 14A.

While state machine 900 of the present disclosure has been designed to use a sequence of two serialized two bit patterns 924 and 926 for synchronization, it could be designed to use a longer sequence of serialized two bit patterns for synchronization if desired. Using a longer sequence of two bit patterns would further reduce the possibility of synchronization failure between the PSC and SPC due to the previously mentioned connection process during time 920. Also a longer synchronization pattern sequence would improve the state machine's 900 ability to return to state 904, when DIO is not externally driven, in the event unexpected signaling were to occur on the state machine's IN input. While the example two bit patterns 924 and 926 used two 0's and two 1's respectively, the two bits of a pattern may use any desired or necessary combinations of 0's and 1's as well. The TMS portion of the last two bit pattern of a pattern sequence will be the first TMS input the Tap Domains 104 and TSM circuit 706 respond to. In the FIG. 9C example, the TMS portion of pattern 926 was set to logic 1 to cause the Tap Domains 104 and TSM circuit 706 to remain in the TLR state following synchronization. If the TMS portion of pattern 926 had been set to logic 0, the Tap Domains 104 and TSM circuit 706 would have transitioned to the RTI state following synchronization.

Following the above described PSC and SPC synchronization process, the PSC may begin inputting serialized TDO and TMS patterns to the SPC to scan JTAG instructions or data into the Tap Domains 104. The following example describes the PSC inputting serialized TDO and TMS patterns to the SPC to cause the Tap Domains 104 to perform an instruction scan operation according to the Tap state diagram of FIG. 10.

The SPC inputs a first serialized TDO (X) and TMS (0) pattern 928 from the PSC which is input to SIPO 702 and applied to the TDI and TMS input Tap Domains 104 and the TMS input of TSM 706 via update register 704 during UCK 929. The X in the TDO portion of the pattern indicates that TDO is a "don't care" signal. This first TDI and TMS pattern input to Tap Domains 104 and TSM 706 causes the Tap Domains and TSM to transition from the Test Logic Reset (TLR) state to the Run Test/Idle (RTI) state (FIG. 10) in response to TCK 942. On the falling edge of TCK 942 the TSM 706 sets its RST signal high to remove the reset condition at the input of OR gate 808 of controller 700. In response to RST going high, state machine 900 transitions to state 914 on the next rising edge of CLK 310. The state machine sets the CE output low in state 914 which causes FF 902 to output a low on CENA on the falling edge of CLK 310. State machine 900 will remain in state 914 while the RST signal is high.

The SPC inputs a second serialized TDO (X) and TMS (1) pattern 930 from PSC which is input to SIPO 702 and applied to the TDI and TMS input Tap Domains 104 and the TMS input of TSM 706 via update register 704 during UCK 931. This second TDI and TMS pattern causes the Tap Domains 104 and TSM to transition from the RTI state to the Select-DR (SLD) state in response to TCK 944.

The SPC inputs a third serialized TDO (X) and TMS (1) pattern 932 from PSC which is input to SIPO 702 and applied to the TDI and TMS input Tap Domains 104 and the TMS input of TSM 706 via update register 704 during UCK 933. This third TDI and TMS pattern causes the Tap Domains 104 and TSM to transition from the SLD state to the Select-IR (SLI) state in response to TCK 946.

The SPC inputs a fourth serialized TDO (X) and TMS (0) pattern 934 from PSC which is input to SIPO 702 and applied to the TDI and TMS input Tap Domains 104 and the TMS input of TSM 706 via update register 704 during UCK 935. This fourth TDI and TMS pattern causes the Tap Domains 104 and TSM to transition from the SLI state to the Capture-IR (CPI) state in response to TCK 948.

The SPC inputs a fifth serialized TDO (0) and TMS (0) pattern 936 from PSC which is input to SIPO 702 and applied to the TDI and TMS input Tap Domains 104 and the TMS input of TSM 706 via update register 704 during UCK 937. This fifth TDI and TMS pattern causes the Tap Domains 104 and TSM to transition from the CPI state to the Shift-IR (SHI) state in response to TCK 950. When the TSM 706 transitions to the SHI state it's OE output is set to enable the output drive of I/O circuit 710 such that the first TDO output from the Tap Domains 104 can be output on DIO 308 to be input to the JTAG controller's TDI input via I/O circuit 504 of PSC controller 500. TSM 706 sets its OE to enable the output drive of I/O circuit 710 whenever the TSM (and Tap Domains) is in the Shift-IR or Shift-DR states of FIG. 10.

The SPC inputs a sixth serialized TDO (1) and TMS (0) pattern 938 from PSC which is input to SIPO 702 and applied to the TDI and TMS input Tap Domains 104 and the TMS input of TSM 706 via update register 704 during UCK 939. This sixth TDI and TMS pattern causes the Tap Domains 104 and TSM to remain in the SHI state in response to TCK 952. In pattern 938, TDO is shown set to a 1 to indicate that the first TDI input to be shifted into the Tap Domains 104 is a logic 1. On the rising edge of TCK 952 the first TDI input (1) of the sixth pattern 938 is shifted into the Tap Domains 104. Also the first TDO output from the TAP Domains 104 is input to the TDI input of the JTAG controller 100 on the rising edge of a CKIN input which is synchronized to TCK 952.

For as long as serialized patterns (940, 942, . . . ) are input to cause the Tap Domains 104 (and TMS 706) to remain in the SHI state (i.e. TMS portion of the patterns=0), the TDI input portion of each pattern will be input to the Tap Domains 104 while TDO outputs from the Tap Domains will be input to the JTAG controller 100. When the shifting in and out of TDI and TDO is complete, the PSC will input serialized patterns with the TMS portion of the patterns set to move the Tap Domains 104 and TMS 706 from the Shift-IR state (SHI) to the Exit1-IR state, then to any other state according to the Tap state diagram of FIG. 10.

While the above process described performing an instruction scan operation between the JTAG controller and Tap Domains of the target IC, data scan operations may be similarly performed. Instruction and data scan operations using serialized TDI and TMS inputs from the JTAG controller and TDO outputs from the Tap Domains can be used to perform test, emulation, debug, trace, and/or other operations via the two signal DIO 308 and CLK 310 interface between the PSC and SPC.

When an operation is complete, the JTAG controller can output a string of serialized TDO and TMS patterns with the TMS portion of each pattern set to a logic one to cause the Tap Domains 104 and the TSM circuit 706 to transition into the Test Logic Reset state of FIG. 10. As seen in FIG. 10, the Tap state machine is designed to transition from any of its states to the Test Logic Reset state whenever it receives at least 5 logic high inputs on TMS. Therefore 5 serialized TDO and TMS patterns each with TMS high will cause the Tap Domains 104 and TSM 706 to enter the Test Logic Reset state.

When the TSM 706 enters the Test Logic Reset state it will set the RST output low which will reset the controller 700 and cause the MRS 708 state machine 900 to enter state 904, which will result in the signal levels shown during time reference 918 of the timing diagram of FIG. 9C. After the SPC circuitry has been reset by the RST signal the DIO and CLK connection between the PSC and SPC can be removed. During the PSC and SPC disconnect step, temporary signal glitching/bounce may occur on the DIO signal. The previously described state machine 900 states in section 916 of FIG. 9B come into play once again to filter the IN input to the state machine such that the state machine remains in or returns to state 904 following any undesired temporary DIO signaling that may occur during the disconnect step. Following the disconnect step, the state machine will be in state 904 with the MRST output low, which maintains a reset condition on controller 700, TSM 706, and Tap Domains 104.

Figure 11A:
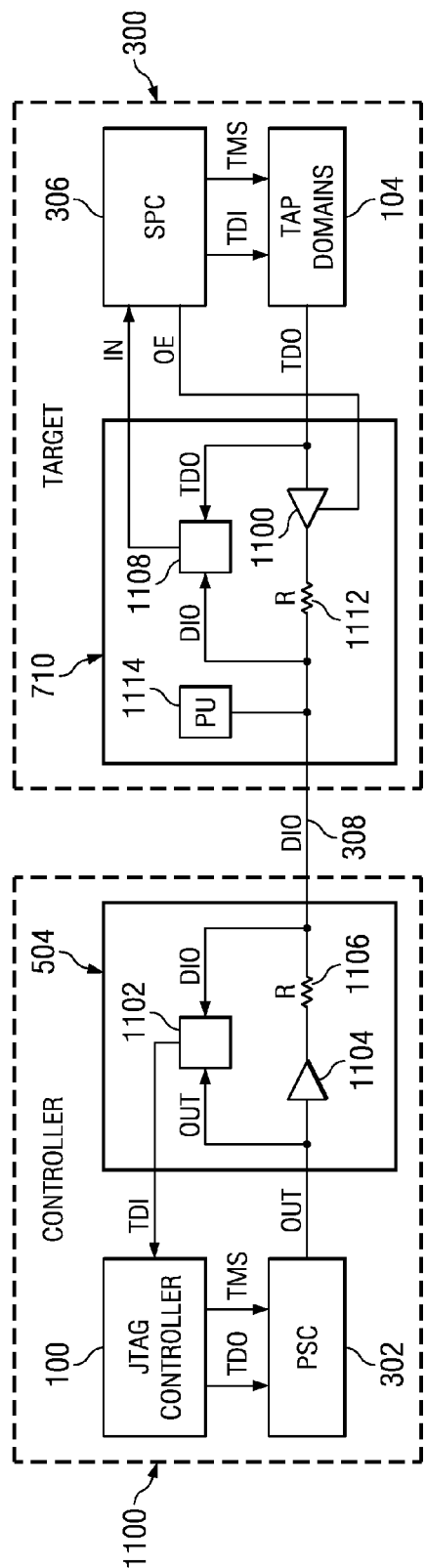
FIG. 11A illustrates a circuit example of the input/output (I/O) circuits within the PSC and SPC circuits.

FIG. 11A illustrates an example of a JTAG controller 100 and PSC 302 arrangement 1100 interfaced the SPC 306 and Tap Domains 104 of target IC 300 via DIO 308 signal connections between I/O circuit 504 of arrangement 1100 and I/O circuit 710 of the target IC. For simplification, the CLK 310 signal that accompanies the DIO signal 308 is not shown in this example. Also for simplification and ease of description, the I/O circuits 504 and 710 are shown to exist outside the PSC 302 and SPC 306 respectively, instead of inside as previously shown in FIGS. 5A and 7A. I/O circuit 504 is coupled to the PSC 302 via the OUT signal and to the JTAG controller 100 via the TDI signal. I/O circuit 710 is coupled to the Tap Domains 104 via the TDO signal and to the SPC via the IN and OE signals.

I/O circuit 504 consists of an input circuit 1102, an output buffer 1104, and a resistor 1106. The OUT signal is coupled to the input of buffer 1104 and to a first input of the input circuit 1102. The output of the buffer 1104 is coupled to the DIO signal via resistor 1106. The DIO signal is coupled to a second input of the input circuit 1102. The output of the input circuit 1102 is coupled to the TDI input of the JTAG controller 100.

I/O circuit 710 consists of an input circuit 1108, an output buffer 1110, a resistor 1112, and a pull up (PU) circuit 1114. The TDO signal is coupled to the input of buffer 1110 and to a first input of the input circuit 1108. The output of the buffer 1110 is coupled to the DIO signal via resistor 1112. The DIO signal is coupled to a second input of the input circuit 1108 and to the PU circuit 1112. The output of the input circuit 1108 is coupled to the IN input of SPC 306.

The PU circuit 1114 is used to set the DIO signal input to input circuit 1108 high when the DIO signal is not being driven by either buffer 1104 or 1110. For example, when the JTAG controller and PSC arrangement 1100 is not connected to the DIO of the target IC and while the output drive of buffer 1110 of the target IC is disabled by the OE signal, the PU circuit 1114 will set the DIO signal high so that logic ones are input to the SPC 306 from the IN signal output of input circuit 1108 high. The high on the IN signal will cause the state machine 900 of MRS circuit 708 to remain in state 904 of FIG. 9B, as previously described.

The output buffer 1104 of I/O circuit 504 and the output buffer 1110 of I/O circuit 710 will preferably be designed to have approximately the same current sink/source drive strength. Also the resistors 1106 and 1112 of I/O circuits 504 and 710 will have approximately the same resistance.

Figure 11B:
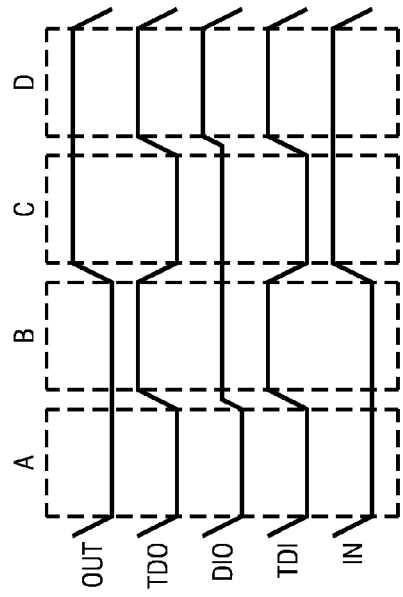
FIG. 11B illustrates the signaling cases for the I/O circuits of FIG. 11A.
Figure 12:
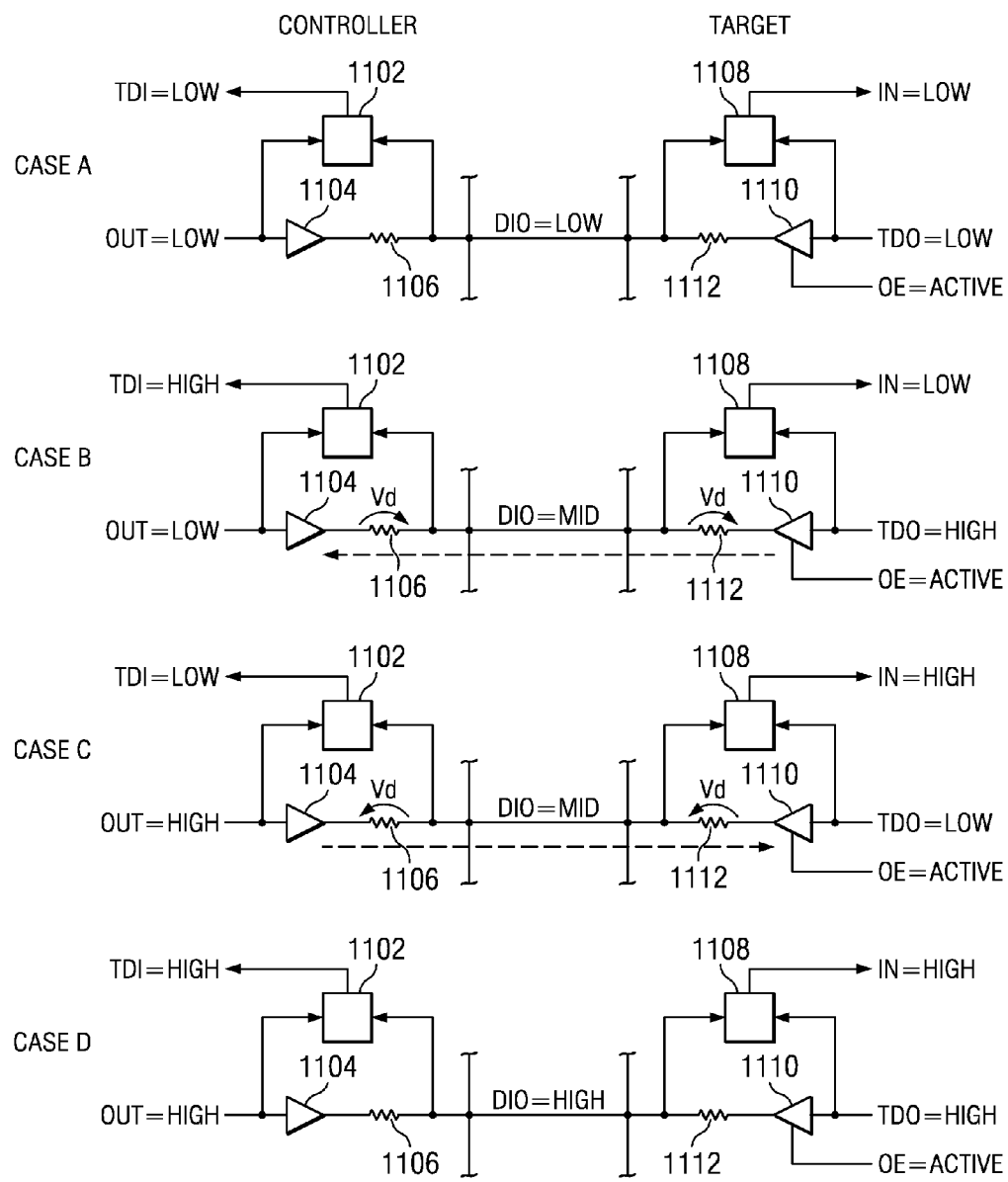
FIG. 12 illustrates each signaling case of FIG. 11B in more detail.

FIG. 11B illustrates timing waveforms for the four cases A-D in which simultaneous data communication occurs between the I/O circuits 504 and 710 via DIO 308. Each case A-D is indicated in the timing diagram by vertical dotted line boxes. FIG. 12 illustrates the current flow on the DIO signal wire during each of the four cases A-D. In these examples, the OE input to buffer 1110 is set to enable the buffer 1110 to drive the DIO signal.

Case A shows PSC 302 driving OUT low and Tap Domains 104 driving TDO low. As seen in Case A of FIG. 12, with lows being output from both buffers 1104 and 1110 only a small amount of current flows on the DIO signal wire. This small current flow does not develop a significant voltage drop across resistors 1106 and 1112. Thus the DIO signal input to the input circuits 1102 and 1108 will be easily detectable as being a low signal input. In response to this OUT and TDO output condition the DIO signal is driven low. With OUT and DIO low, the input circuit 1102 inputs a low on the TDI input to JTAG controller 100. With TDO and DIO low, the input circuit 1108 inputs a low on the IN input to SPC 306.

Case B shows PSC 302 driving OUT low and Tap Domains 104 driving TDO high. As seen in Case B of FIG. 12, with a low being output from buffer 1104 and a high being output from buffer 1110 a larger current flows between the buffers on the DIO signal wire. The resistors 1106 and 1112 serve to limit this larger current flow and the voltage drops developed across them establish mid level voltage on the DIO wire that is easily detectable by the input circuits 1102 and 1108 from being either high or low. In response to this OUT and TDO output condition the DIO signal is driven to a mid voltage level. With OUT low and DIO at a mid voltage, the input circuit 1102 inputs a high on the TDI input to JTAG controller 100. With TDO high and DIO at a mid voltage, the input circuit 1108 inputs a low on the IN input to SPC 306.

Case C shows PSC 302 driving OUT high and Tap Domains 104 driving TDO low. As seen in Case C of FIG. 12, with a high being output from buffer 1104 and a low being output from buffer 1110 a larger current flows between the buffers on the DIO signal wire. The resistors 1106 and 1112 serve to limit this larger current flow and the voltage drops developed across them establish mid level voltage on the DIO wire that is easily detectable by the input circuits 1102 and 1108 from being either high or low. In response to this OUT and TDO output condition the DIO signal is driven to a mid voltage level. With OUT high and DIO at a mid voltage, the input circuit 1102 inputs a low on the TDI input to JTAG controller 100. With TDO low and DIO at a mid voltage, the input circuit 1108 inputs a high on the IN input to SPC 306.

Case D shows PSC 302 driving OUT high and Tap Domains 104 driving TDO high. As seen in Case D of FIG. 12, with highs being output from both buffers 1104 and 1110 only a small amount of current flows on the DIO signal wire. This small current flow does not develop a significant voltage drop across resistors 1106 and 1112. Thus the DIO signal input to the input circuits 1102 and 1108 will be easily detectable as being a high signal input. In response to this OUT and TDO output condition the DIO signal is driven high. With OUT and DIO high, the input circuit 1102 inputs a high on the TDI input to JTAG controller 100. With TDO and DIO high, the input circuit 1108 inputs a high on the IN input to SPC 306.

FIG. 13A illustrates one example of how to design an input circuit 1300 that can be used as either an input circuit 1102 or 1108. The input circuit 1300 includes a voltage comparator circuit 1302, a multiplexers 1304, an inverter 1306, and a buffer 1308. The voltage comparator circuit 1302 inputs voltages from DIO and outputs digital control signals S0 and S1 to multiplexer 1304. As seen, a first voltage (V) to ground (G) leg 1310 of voltage comparator circuit 1302 comprises a series P-channel transistor and a current source and a second voltage to ground leg 1312 comprises a series N-channel transistor and a current source. As seen, S1 is connected at a point between the P-channel transistor and current source of the first leg 1310 and S0 is connected at a point between the N-channel transistor and current source of the second leg 1312. The gates of the transistors are connected to DIO to allow voltages on DIO to turn the transistors on and off.

The operation of the voltage comparator circuit 1302 and multiplexer 1304 is shown in the truth table of FIG. 13B and described herein. If the voltage on DIO is low, the S0 and S1 outputs are set high, which causes the multiplexer 1304 to select its low input 1314 and output the low input on the TDI/IN (TDI for circuit 1102 and IN for circuit 1108) signal via buffer 1308. If the voltage on DIO is at a mid level, the S0 is set low and the S1 is set high, which causes the multiplexer 1304 to select its inverted OUT/TDO (OUT for circuit 1102 and TDO for circuit 1108) input signal 1316 and output the inverted OUT/TDO signal to the TDI/IN signal via and buffer 1308. If the voltage on DIO is high, the S0 and S1 outputs are set low, which causes the multiplexer 1304 to select its high input 1318 and output the high input to the TDI/IN signal via and buffer 1308.

From the above description it is clear that the input circuit 1300 will; (1) input a low on TDI/IN if the DIO signal is low, (2) input a high on TDI/IN if the DIO signal is high, and (3) will input the inverse of OUT/TDO on TDI/IN if the DIO signal is at a mid level voltage between high and low.

Referring back to FIG. 11A and in reference to the above description of input circuit 1300 it is clear that, (1) If DIO is high, input circuits 1102 and 1108 will input highs to the JTAG controller 100 and SPC 306 respectively.

(2) If DIO is low, input circuits 1102 and 1108 will input lows to the JTAG controller 100 and SPC 306 respectively.

(3) If DIO is mid level and the OUT signal from PSC 302 is low, input circuit 1102 will know that the Tap Domain 104 is outputting a high on TDO to cause the mid level on DIO. Input circuit 1102 will therefore input a high to the TDI input of JTAG controller 100.

(4) If DIO is mid level and the OUT signal from PSC 302 is high, input circuit 1102 will know that the Tap Domain 104 is outputting a low on TDO to cause the mid level on DIO. Input circuit 1102 will therefore input a low to the TDI input of JTAG controller 100.

(5) If DIO is mid level and the TDO signal from Tap Domain 104 is low, input circuit 1108 will know that the PSC 302 is outputting a high on OUT to cause the mid level on DIO. Input circuit 1108 will therefore input a high to the IN input of SPC 306; and (6) If DIO is mid level and the TDO signal from Tap Domain 104 is high, input circuit 1108 will know that the PSC 302 is outputting a low on OUT to cause the mid level on DIO. Input circuit 1108 will therefore input a low to the IN input of SPC 306.

FIG. 14A shows a complete arrangement where the JTAG controller 100 and PSC 302 are connected to and are communicating with the SPC 306 and Tap Domains 104 of target IC 300 via the DIO 308 and CLK 310 signals. For simplification only the circuit elements of the PSC 302 and SPC 306 that are involved with the communication process are shown. The timing diagram of FIG. 14B details the communication process.

In the timing diagram of FIG. 14B, both the controllers 500 and 700 of PSC and SPC, respectively, have been synchronized as previously described and are actively operating their respective LD and CKIN and UCK and TCK signals in response to the CLK signal 310. As seen and previously mentioned, the LD signal of the PSC operates synchronous with the UCK signal of the SPC, and the CKIN signal of the PSC operates synchronous with the TCK signal of the SPC. For simplification the CKIN and TCK signals are shown as one clock signal.

During LD signal 1402 TMS and TDO pattern N 1404 from JTAG controller 100 is loaded into PISO 502. The TMS portion of the loaded pattern is shifted from PISO 502 to SIPO 702 during CLK 1406 and the TDO portion of the loaded pattern is shifted from PISO 502 to SIPO 702 during CLK 1408. CKIN 1410 advances the JTAG controller to output the next TMS and TDO pattern N+1 1412 and to input the TDO output 1415 from the Tap Domains (if in the Shift-DR or Shift-IR state). TCK 1410 causes the TAP Domains 104 to respond to the previously transmitted TDI and TMS input pattern N−1 1414 input to the Tap Domains during UCK 1413. Also during TCK 1410, the Tap Domains will output the next TDO output to be input to the JTAG controller (if in the Shift-DR or Shift-IR state).

During LD signal 1418 TMS and TDO pattern N+1 1412 from JTAG controller 100 is loaded into PISO 502. The TMS portion of the loaded pattern is shifted from PISO 502 to SIPO 702 during CLK 1420 and the TDO portion of the loaded pattern is shifted from PISO 502 to SIPO 702 during CLK 1422. CKIN 1424 advances the JTAG controller to output the next TMS and TDO pattern N+2 1426 and to input the TDO output 1428 from the Tap Domains. TCK 1424 causes the TAP Domains 104 to respond to TDI and TMS input pattern N 1416 input to the Tap Domains during UCK 1413. Also during TCK 1424, the Tap Domains will output the next TDO output 1432 to be input to the JTAG controller.

The above described timing example of the communication between the JTAG controller 100 and Tap Domains 104, via PSC and SPC, continues while a DIO and CLK connection exists between the PSC and SPC and while the CLK signal 310 is active.

Figure 14C:
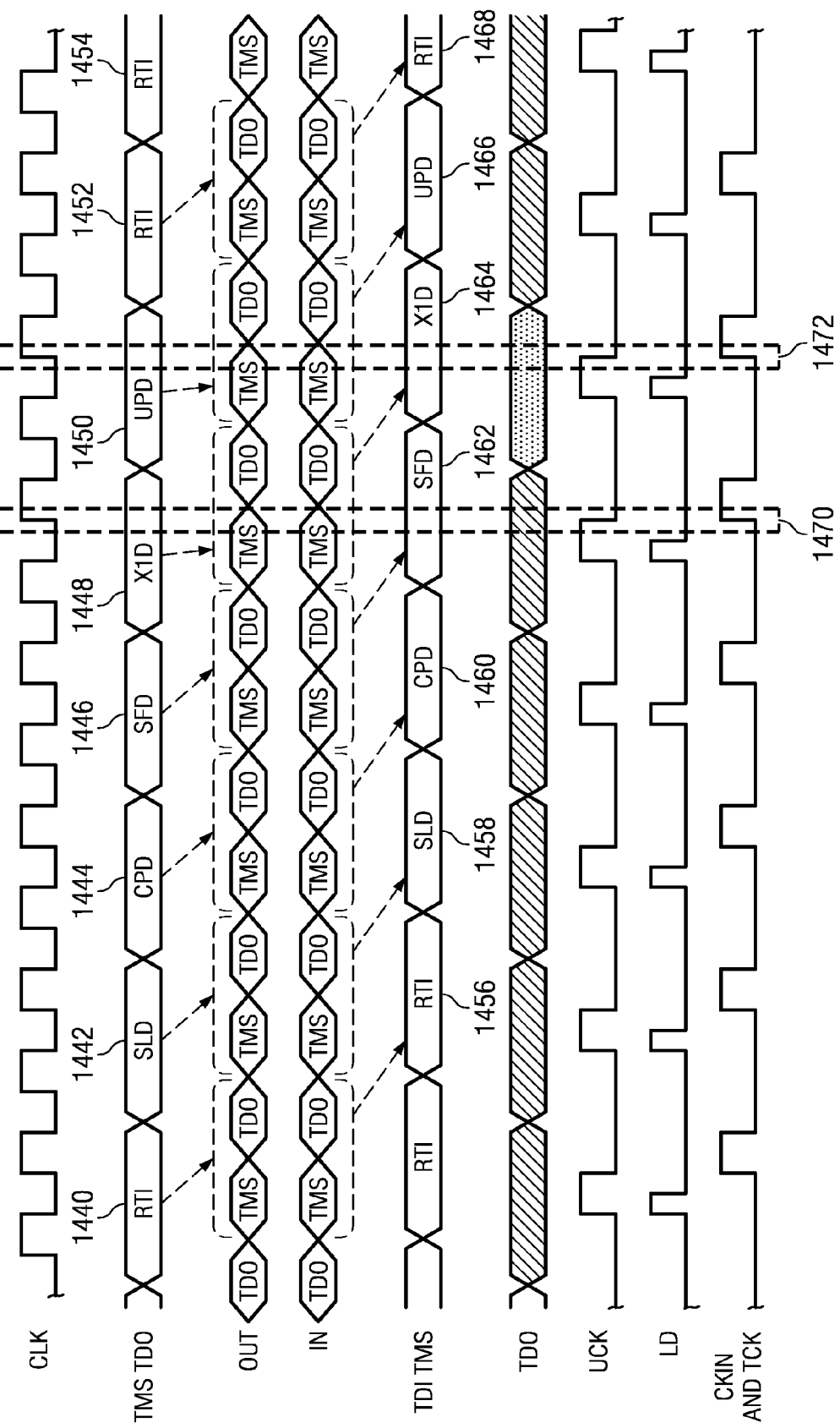
FIG. 14C illustrates a timing diagram of the operation of the PSC and SPC circuits of FIG. 14A performing a single bit data register scan between the JTAG controller and the Tap Domains of the target IC.

FIG. 14C illustrates a timing example of the arrangement of FIG. 14A performing a single data register shift operation between the JTAG controller and Tap Domains. As seen the JTAG controller outputs a sequence of TMS and TDO patterns 1440-1454 that will control the Tap Domains to transition from the Run Test/Idle (RTI) state, to the Select-DR (SLD) state, to the Capture-DR (CPD) state, to the Select-DR (SLD) state, to the Exit1-DR (X1D) state, to the Update-DR (UPD) state, and back to the RTI state of FIG. 10. This Tap state sequence will cause a one bit data register shift operation to occur between the JTAG controller and Tap Domains. The sequence of patterns 1440-1454 output from the JTAG controller is serialized by the PSC and de-serialized by the SPC to be input to the Tap Domains as TDI and TMS pattern sequences 1454-1468. As seen the process of serializing and de-serializing the patterns causes TDI and TMS patterns input to the Tap Domains to lag behind the TMS and TDO patterns output from the JTAG controller.

Figure 1:
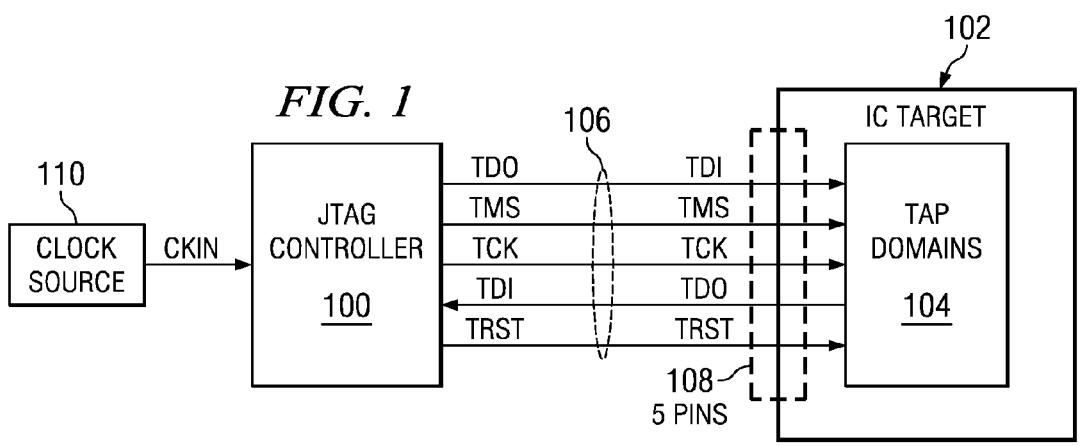
FIG. 1 illustrates a conventional 5 signal interface between a JTAG controller and target IC.
Figure 2:
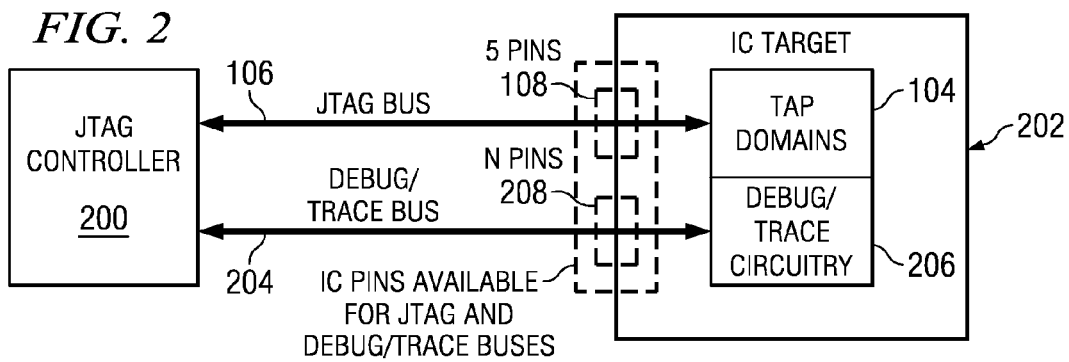
FIG. 2 illustrates a conventional JTAG controller interfaced to a target IC via a 5 signal JTAG bus and an N signal Debug/Trace bus.

If the JTAG controller were conventionally connected to the Tap Domains as seen in FIG. 1, the TDO to TDI data shift operation between them would occur on the rising edge of the CKIN and TCK at time 1470, i.e. when the Tap Domains transition from the Shift-DR (SFD) state to the Exit1-DR (X1D) state. However due to the pattern lag, the TDO to TDI data shift operation between them occurs on the rising edge of the CKIN and TCK at time 1472. The shift in of the TDO data output from the JTAG controller to the TDI input of the Tap Domains is not effected by the pattern lag since the TDO data remains in the TDI and TMS pattern input to the Tap Domains following the serialization and de-serialization process and is clocked into the Tap Domains on the rising edge of TCK 1472. However, the JTAG controller will not input the correct TDO output from the Tap Domains on the rising edge of CKIN 1470 since, due to the pattern lag, the correct TDO output (shown as dark filled) from the Tap Domains is not output from the Tap Domains until the falling edge of TCK 1470. Thus while TDO data from the JTAG controller is correctly input as TDI date to the Tap Domains, the TDO output from the Tap Domains is incorrectly input as TDI data to the JTAG controller.

JTAG controllers that are designed using Texas Instruments SN74/54ACT8990 JTAG bus controller chips can resolve the above mentioned pattern lag problem. The SN74/54ACT8990 JTAG bus controller chips were designed to operate with cabling between JTAG controllers and target ICs that can register the TMS and TDO outputs from the JTAG controller to the TMS and TDI inputs of the target IC.

Figure 15:
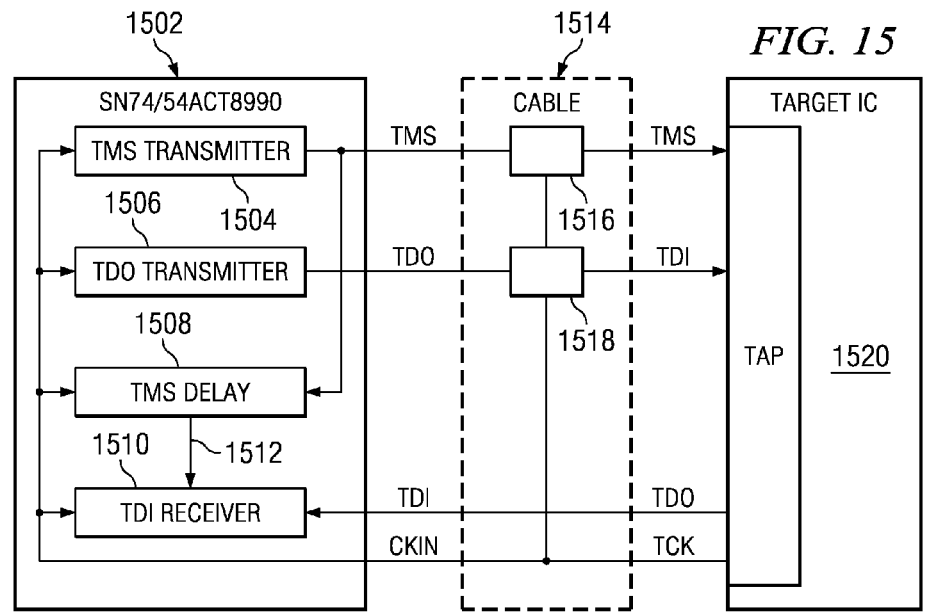
FIG. 15 illustrates a Texas Instruments SN74ACT8990 JTAG bus controller chip operating to compensate for cable delays.

FIG. 15 illustrates an arrangement whereby the ACT8990 JTAG controller chip 1502 is interfaced to a target IC 1520 via a cable 1514 that includes FFs 1516-1518 in the path between the ACT8990's TMS and TDO outputs and the target IC's TMS and TDI inputs. In this example the target IC sources the CKIN to the ACT8990 and also times the operation of FFs 1516 and 1518. As seen, the FFs 1516 and 1518 cause the TMS and TDI inputs to the target IC to lag the TMS and TDO output from the ACT8990 similar to the way the PSC and SPC circuits of Figure A simplified block diagram of the ACT 8990 shows it containing a circuit 1504 for transmitting the TMS signal, a circuit 1506 for transmitting the TDO signal, a circuit 1510 from receiving the TDI signal, and a circuit 1508 for delaying the TMS signal 1512 input to the TDI receiver circuit 1510. The TDI receiver circuit responds to the TMS signal 1512, as per the Tap state diagram of FIG. 10, to know when to input the TDI signal. In this example, all the circuits 1504-1510 are timed by the CKIN input from the TCK output of IC 1520.

If no FFs existed in the cable, i.e. TMS and TDO output of the ACT8990 were directly connected to TMS and TDI inputs of the target IC, the TMS delay circuit would be set to not delay the TMS signal input to the TDI receiver. In this case the TDI receiver 1510 operates in step with the Tap of the target IC 1520 such that TDI receiver 1510 inputs TDI data at the same time that the Tap of IC 1520 inputs TDI data.

If the FFs existed in the path as shown, the TMS delay circuit is set to delay the operation of the TDI receiver for one CKIN cycle to allow the operation of the TDI receiver to be synchronized with the operation of the Tap of IC 1520. By delaying the operation of the TDI receiver, the TDI receiver is made to operate in step with the delayed operation of the Tap of target IC 1520 such that TDI receiver 1510 inputs TDI data at the same time that the Tap of IC 1520 inputs TDI data.

While the delay circuit 1508 of the ACT8990 JTAG bus controller chip was originally designed to compensate for delays associated with cables, the present disclosure utilizes the delay circuit 1508 feature to compensate for the delay associated with the serialization and de-serialization operation of the PSC and SPC circuits in FIG. 14A.

For example, if the JTAG controller 100 of FIG. 14A used the ACT8990 chip to control the JTAG bus, the delay circuit 1508 of the ACT8990 could be set to delay the TDI input from the Tap Domains of IC 300 by one CKIN cycle such that the TDI input is correctly received on the rising edge of CKIN 1472, as shown in the timing diagram of FIG. 14C. Thus the previously mentioned lag problem, due to the serialization and de-serialization process of the PSC and SPC circuits, is remedied by using JTAG controllers 100 that incorporate the ACT8990 JTAG bus controller chip or other chips/circuits that can similarly delay the inputting of TDI data from the Tap Domains 104 of FIG. 14A.

Figure 16:
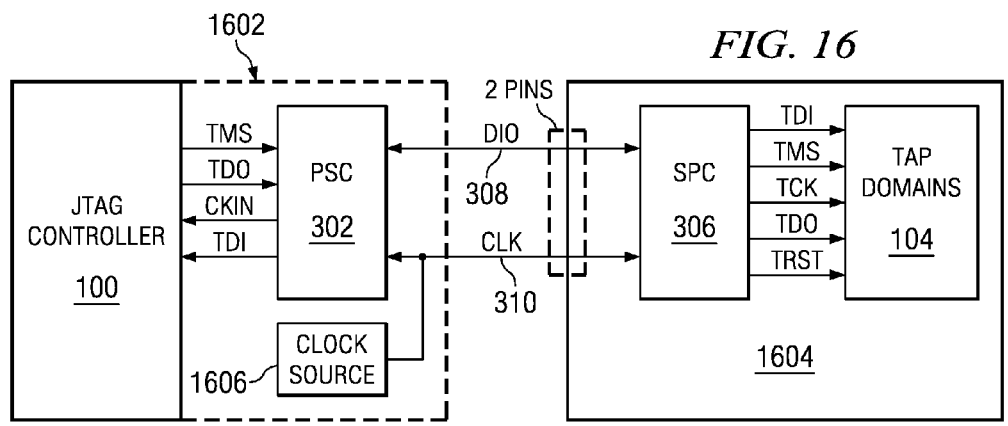
FIG. 16 illustrates a 2 pin realization of the present disclosure whereby the CLK signal is driven by a clock source within the JTAG controller.

FIG. 16 illustrates a first system example wherein a JTAG controller 100 and PSC 302 arrangement 1602 is coupled to the SPC 306 and Tap Domains 104 of a target IC 1604 via DIO 308 and CLK 310 signal wiring. In this example a clock source 1606 within arrangement 1602 is used to drive the CLK signal that times the operation of the PSC and SPC circuits. In this example the target IC 1604 requires two dedicated pins for the DIO and CLK signals.

Figure 17:
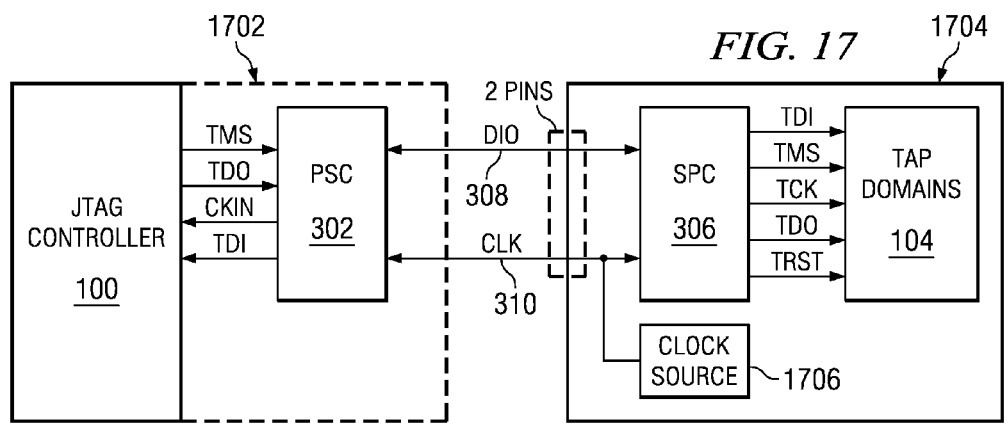
FIG. 17 illustrates a 2 pin realization of the present disclosure whereby the CLK signal is driven by an internal clock source of the target IC.

FIG. 17 illustrates a second system example wherein a JTAG controller 100 and PSC 302 arrangement 1702 is coupled to the SPC 306 and Tap Domains 104 of a target IC 1704 via DIO 308 and CLK 310 signal wiring. In this example a clock source 1706 within target IC 1704 is used to drive the CLK signal that times the operation of the PSC and SPC circuits. In this example the target IC 1704 requires two dedicated pins for the DIO and CLK signals.

Figure 18:
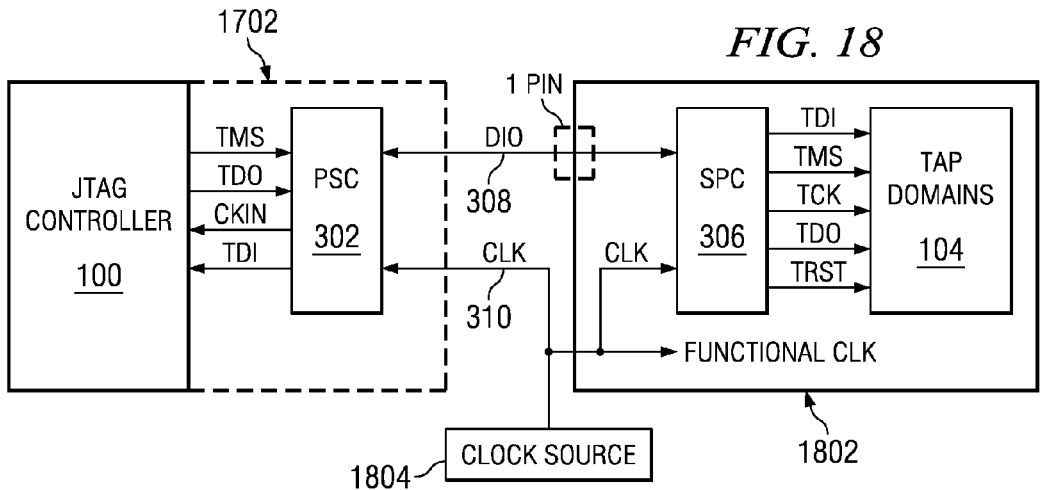
FIG. 18 illustrates a 1 pin realization of the present disclosure whereby the CLK signal is driven by an external clock source that functionally inputs to the target IC.

FIG. 18 illustrates a third system example wherein a JTAG controller 100 and PSC 302 arrangement 1702 is coupled to the SPC 306 and Tap Domains 104 of a target IC 1802 via a DIO 308 signal wire. In this example an external clock source 1804 used to input a functional clock to IC 1802 via a functionally required clock input pin. The external clock source also drives the CLK signal of PSC 302. Since the SPC 306 CLK input is connected to and driven by the IC's functional clock, a dedicated pin for the CLK signal 310 is not required on IC 1802. In this example the target IC 1802 requires only a dedicated pin for the DIO signal.

Figure 19:
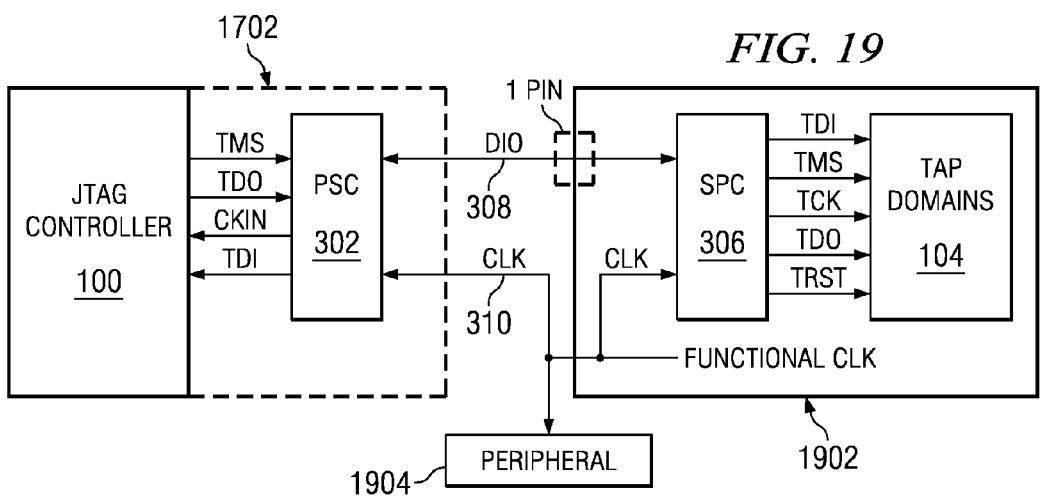
FIG. 19 illustrates a 1 pin realization of the present disclosure whereby the CLK signal is driven by an internal clock source of the target IC that functionally outputs from the IC.

FIG. 19 illustrates a fourth system example wherein a JTAG controller 100 and PSC 302 arrangement 1702 is coupled to the SPC 306 and Tap Domains 104 of a target IC 1802 via a DIO 308 signal wire. In this example a functional clock is output from IC 1902 to drive the clock input of a peripheral circuit 1904 via a functionally required clock output pin. Internal to the IC 1902, the functional clock is connected to and drives the CLK input of SPC 306. External of the IC 1902, the functional clock is connected to and drives the CLK input of PSC 302. Since the PSC 302 CLK input is connected to the external functional clock, a dedicated pin for the CLK signal 310 is not required on IC 1902. In this example the target IC 1902 requires only a dedicated pin for the DIO signal.

Figure 20:
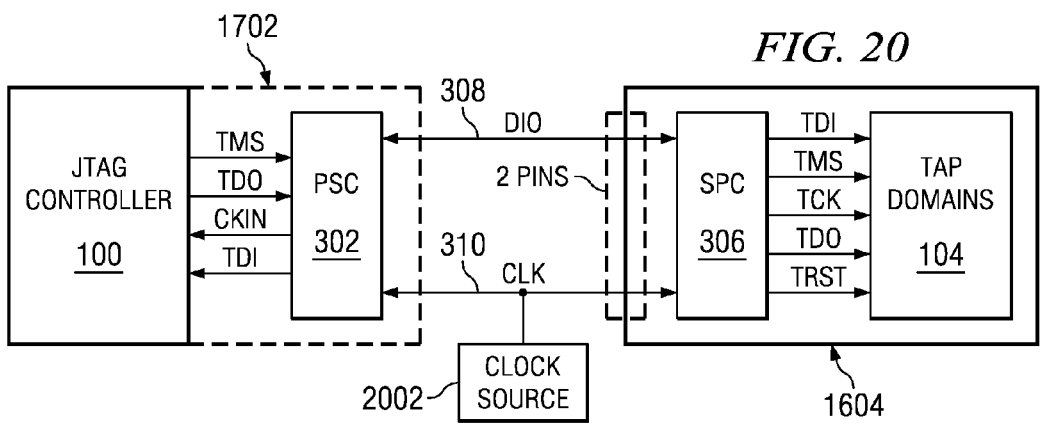
FIG. 20 illustrates a 2 pin realization of the present disclosure whereby the CLK signal is driven by an clock source external of the JTAG controller and target IC.

FIG. 20 illustrates a fifth system example wherein a JTAG controller 100 and PSC 302 arrangement 1702 is coupled to the SPC 306 and Tap Domains 104 of a target IC 1604 via DIO 308 and CLK 310 signal wiring. In this example a clock source 2002 external of both arrangement 1702 and IC 1604 is used to drive the CLK signal that times the operation of the PSC and SPC circuits. In this example the target IC 1604 requires two dedicated pins for the DIO and CLK signals.

The above system examples of FIGS. 16-20 have shown various ways to interface the PSC and SPC circuits together such that at most the interface requires two dedicated IC pins for DIO and CLK and at least the interface only requires one dedicated pin for DIO. Thus the present disclosure is seen to require only one or two dedicated pins on the target IC.

The following Figures illustrate an alternate version of the present disclosure whereby the SPC 302 and PSC 306 circuits do not use I/O circuits 504 and 710, respectively.

Figure 21A:
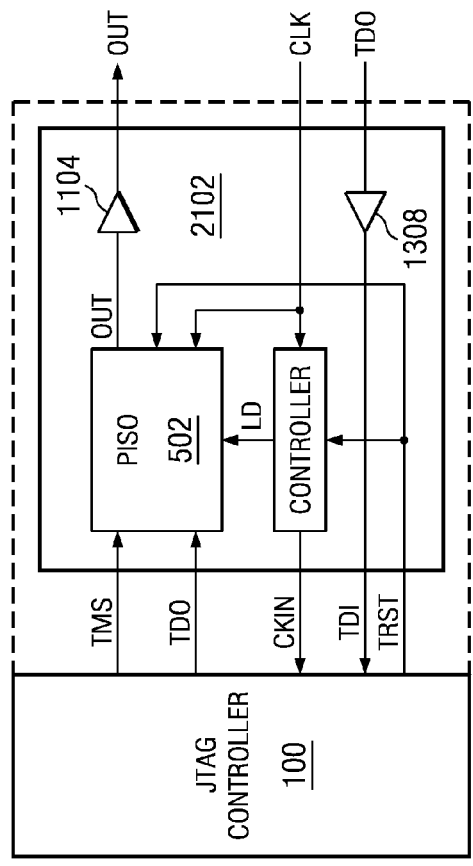
FIG. 21A illustrates an alternate circuit example of the parallel to serial controller (PSC) circuit of the present disclosure.
Figure 21B:
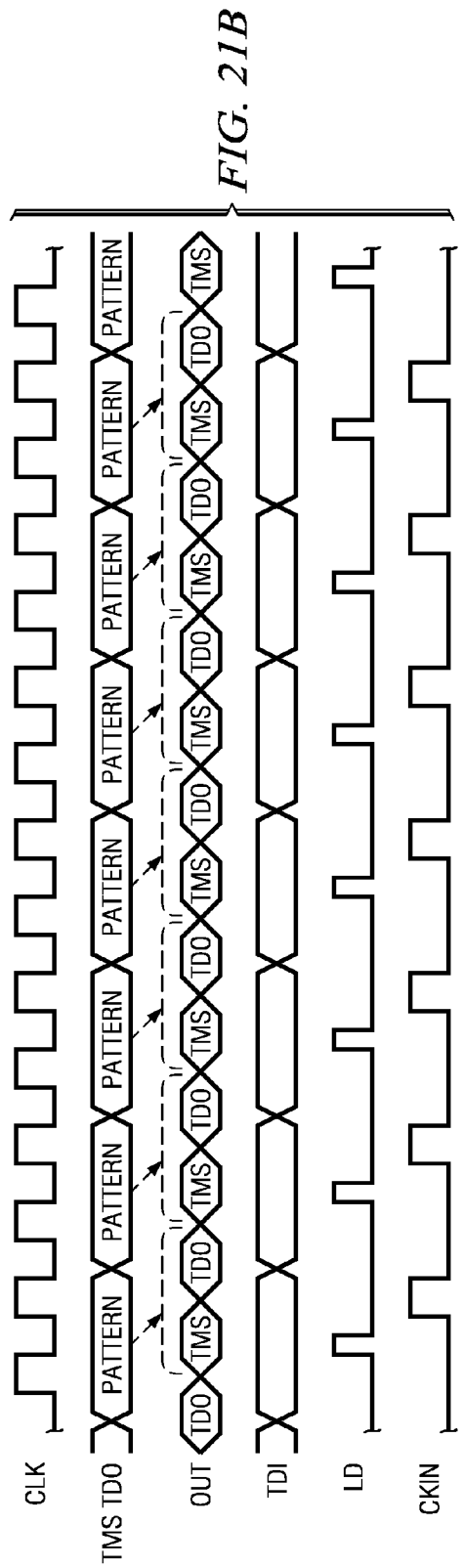
FIG. 21B illustrates a timing diagram of the operation of the alternate PSC circuit of FIG. 5A.

FIG. 21A illustrates a JTAG controller 100 interfaced to an alternate PSC circuit 2102. The PSC circuit 2102 is identical to the PSC 302 of FIG. 5A with the exception that the I/O circuit 504 is not used in PSC circuit 2102. As seen, without the I/O circuit 504 the OUT output from PISO 502 is directly output from the PSC via output buffer 1104. Also as seen, without the I/O circuit 504 the TDO input goes directly to the TDI input of the JTAG controller 100 via an input buffer 1308. As seen in FIG. 21B, the operation timing of the alternate PSC 2102 and JTAG controller 100 is identical to the FIG. 5B timing operation of the PSC 302 and JTAG controller 100 of FIG. 5A.

Figure 22A:
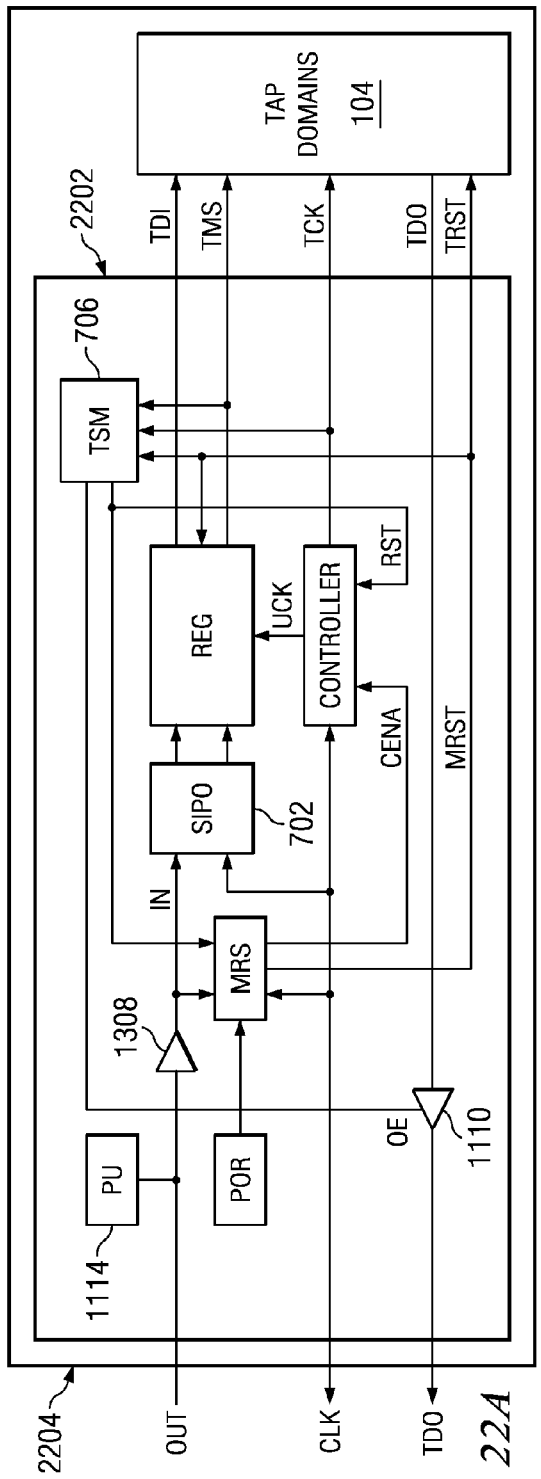
FIG. 22A illustrates an alternate circuit example of the serial to parallel controller (SPC) circuit of the present disclosure.
Figure 22B:
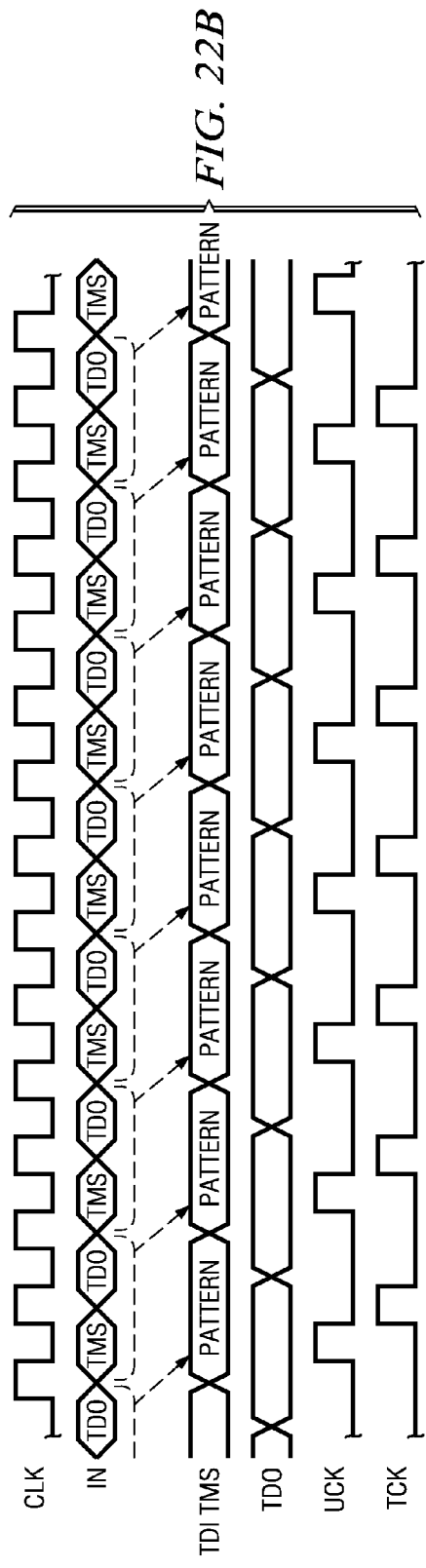
FIG. 22B illustrates a timing diagram of the operation of the SPC circuit of FIG. 7A.

FIG. 22A illustrates an alternate SPC circuit 2202 interfaced to Tap Domains 104 of target IC 2204. The SPC circuit 2202 is identical to the SPC 302 of FIG. 7A with the exception that the I/O circuit 710 is not used in SPC circuit 2202. As seen, without the I/O circuit 710 the OUT input to SPC 2202 is directly input to the MRS 708 and SIPO 702 circuits via a second input buffer 1308. Also as seen, without the I/O circuit 710 the TDO output from Tap Domains 104 is directly output from SPC 2202 via 3-state buffer 1110. Buffer 2206 is enabled by the OE signal from TSM 706. The pull up (PU) element 1114 is connected to the IN signal to pull the IN signal high when it is not being externally driven for reasons previously mentioned. As seen in FIG. 22B, the operation timing of the alternate SPC 2202 and Tap Domains 104 is identical to the FIG. 7B timing operation of the SPC 302 and Tap Domains 104 of FIG. 7A.

Figure 23A:
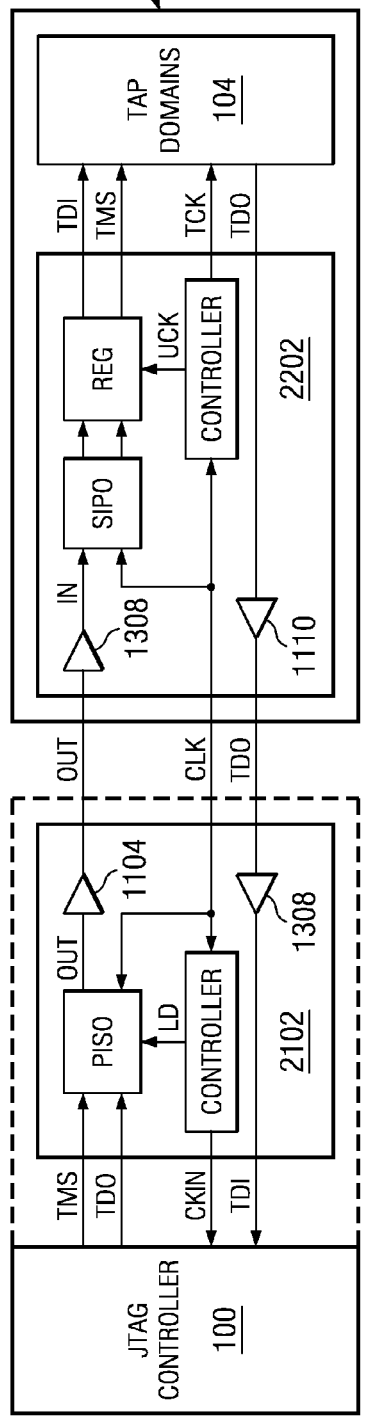
FIG. 23A illustrates the 3 signal connection between the FIG. 21A alternate PSC of the JTAG controller and the FIG. 22A alternate SPC of the target IC of according to the present disclosure.
Figure 23B:
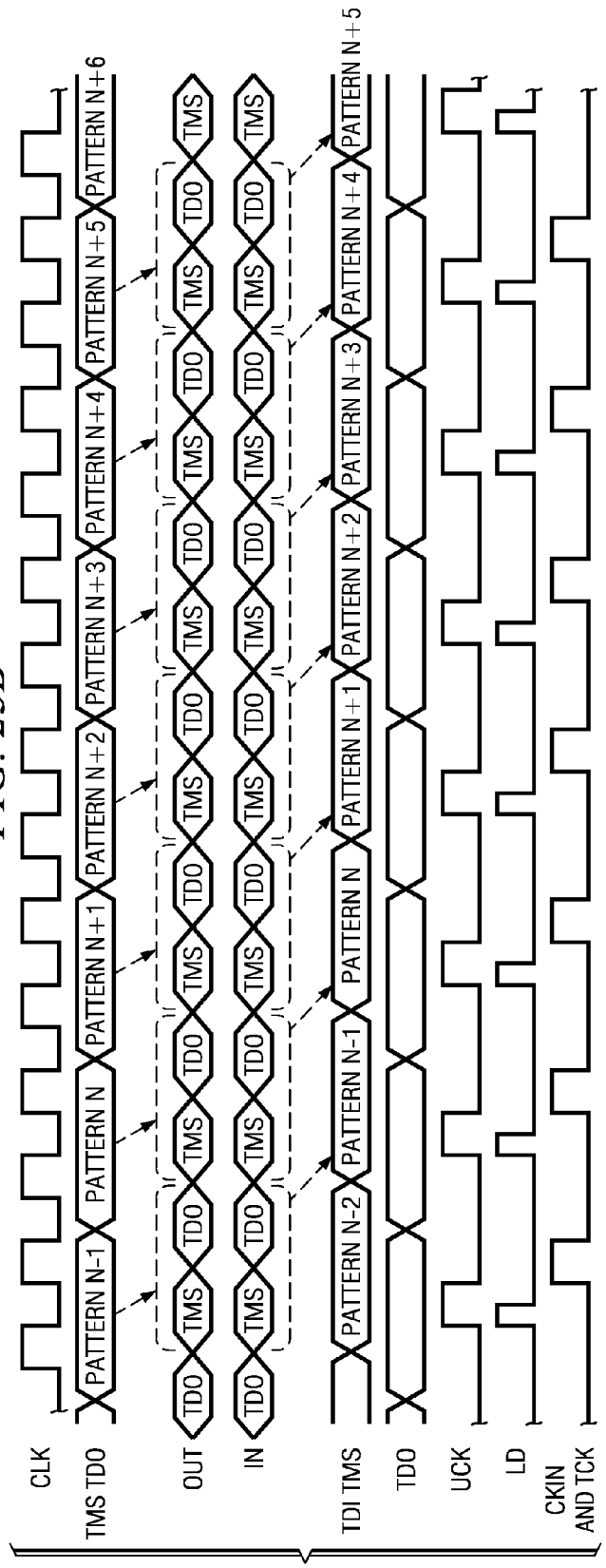
FIG. 23B illustrates a timing diagram of the operation of the alternate FIG. 21A PSC and FIG. 22A SPC circuits performing JTAG transactions between the JTAG controller and the Tap Domains of the target IC.

FIG. 23A shows a complete arrangement where the JTAG controller 100 and alternate PSC 2102 are connected to and are communicating with the alternate SPC 2202 and Tap Domains 104 of target IC 2302 via the OUT, CLK, and TDO signals. For simplification only the circuit elements of the alternate PSC 2102 and SPC 2202 that are involved with the communication process are shown. As seen the OUT output from PSC 2102 is directly input to the IN input of the SPC 2202 and the TDO output from Tap Domains 104 is directly input to the TDI input of JTAG controller 100. As seen in FIG. 23B, the operation timing of the FIG. 23A arrangement is identical to the FIG. 14B timing operation of the FIG. 14A arrangement.

Figure 24:
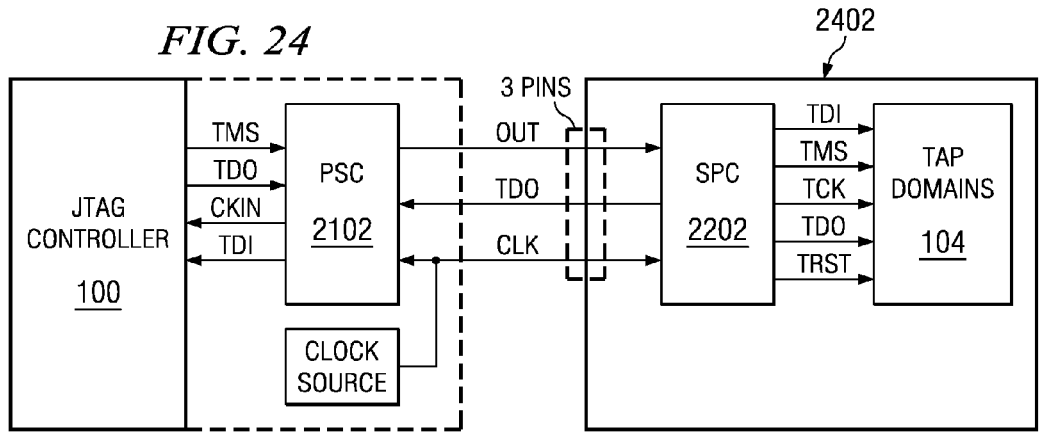
FIG. 24 illustrates a 3 pin realization of the alternate version of the present disclosure whereby the CLK signal is driven by a clock source within the JTAG controller.

FIG. 24 illustrates the previously described clocking arrangement of the FIG. 16 system. In FIG. 24, alternate PSC 2102 is used instead of PSC 302 and alternate SPC 2202 is used instead of SPC 306. As seen, the IC 2402 requires three dedicated pins for OUT, TDO, and CLK.

Figure 25:
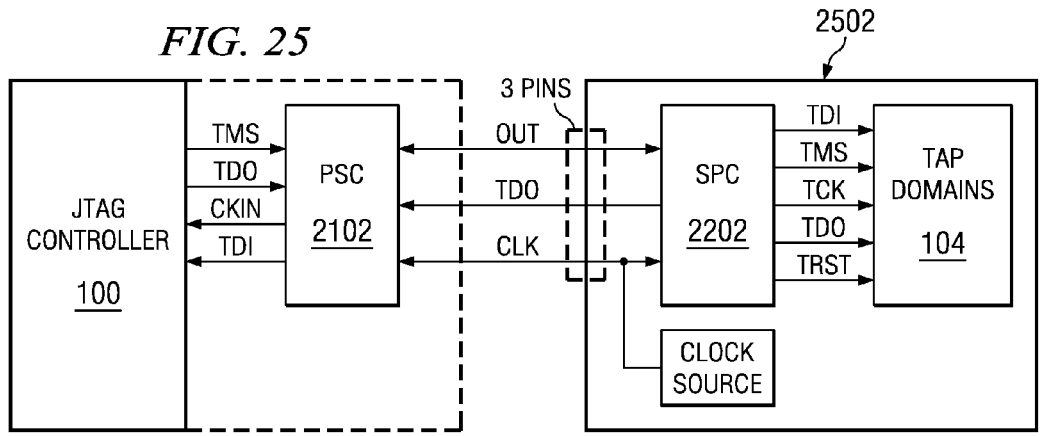
FIG. 25 illustrates a 3 pin realization of the alternate version of the present disclosure whereby the CLK signal is driven by an internal clock source of the target IC.

FIG. 25 illustrates the previously described clocking arrangement of FIG. 17 system. In FIG. 25, alternate PSC 2102 is used instead of PSC 302 and alternate SPC 2202 is used instead of SPC 306. As seen, the IC 2502 requires three dedicated pins for OUT, TDO, and CLK.

Figure 26:
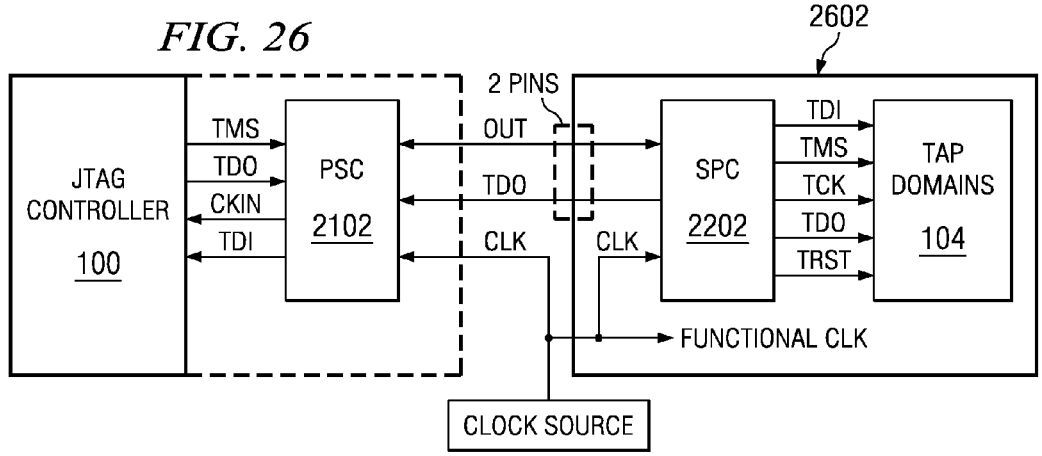
FIG. 26 illustrates a 2 pin realization of the alternate version of the present disclosure whereby the CLK signal is driven by an external clock source that functionally inputs to the target IC.

FIG. 26 illustrates the previously described clocking arrangement of FIG. 18 system. In FIG. 26, alternate PSC 2102 is used instead of PSC 302 and alternate SPC 2202 is used instead of SPC 306. As seen, the IC 2602 requires two dedicated pins for OUT and TDO.

Figure 27:
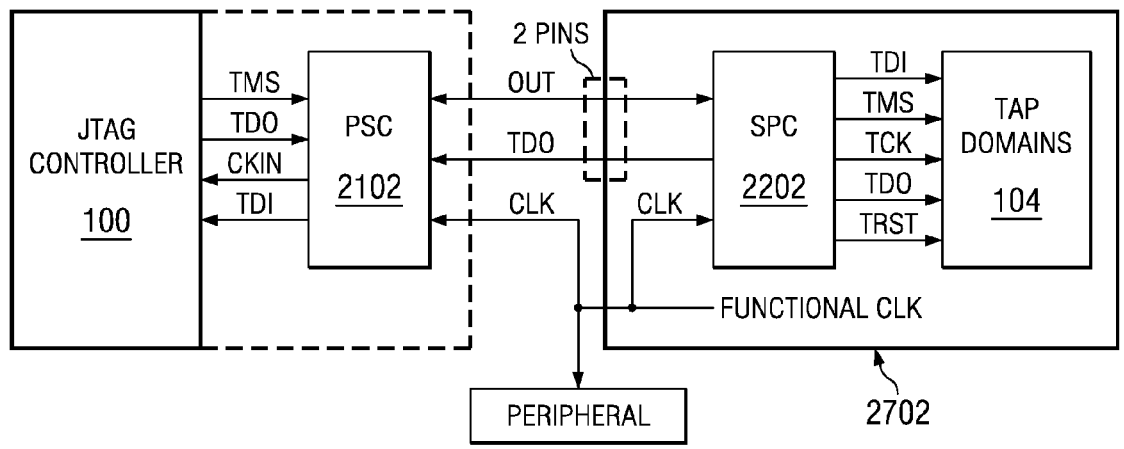
FIG. 27 illustrates a 2 pin realization of the alternate version of the present disclosure whereby the CLK signal is driven by an internal clock source of the target IC that functionally outputs from the IC.

FIG. 27 illustrates the previously described clocking arrangement of FIG. 19 system. In FIG. 27, alternate PSC 2102 is used instead of PSC 302 and alternate SPC 2202 is used instead of SPC 306. As seen, the IC 2702 requires two dedicated pins for OUT and TDO.

Figure 28:
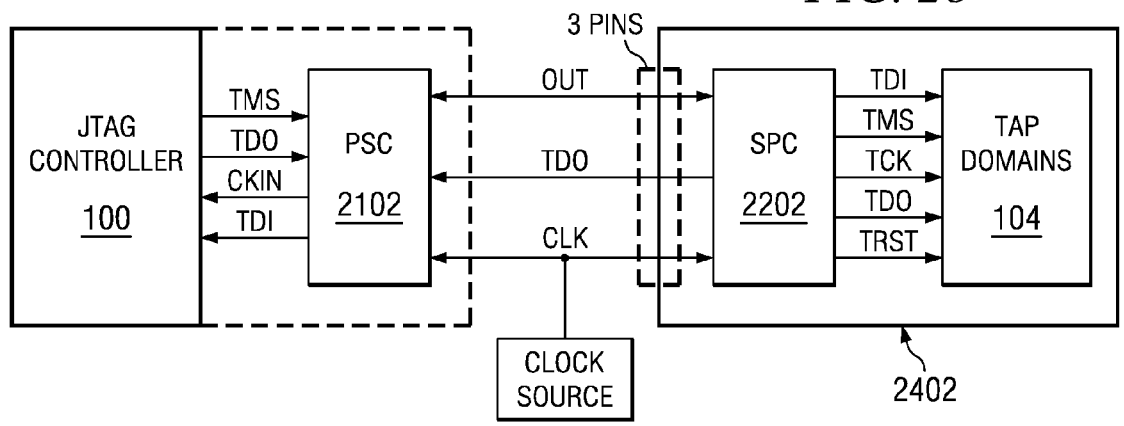
FIG. 28 illustrates a 3 pin realization of the alternate version of the present disclosure whereby the CLK signal is driven by an clock source external of the JTAG controller and target IC.

FIG. 28 illustrates the previously described clocking arrangement of FIG. 20 system. In FIG. 28, alternate PSC 2102 is used instead of PSC 302 and alternate SPC 2202 is used instead of SPC 306. As seen, the IC 2402 requires three dedicated pins for OUT, TDO, and CLK.

The above system examples of FIGS. 24-28 have shown various ways to interface the alternate PSC 2102 and SPC 2202 circuits together such that at most the interface requires three dedicated IC pins for OUT, TDO and CLK, and at least the interface only requires two dedicated pin for OUT and TDO. Thus the alternate version of the present disclosure is seen to require only two or three dedicated pins on the target IC.

In reference to FIGS. 14A, 14B, 14C, 23A, and 23B it is seen that the frequency of the CKIN and TCK signals is one half the frequency of the source driving the CLK signal. Therefore the JTAG controller and the Tap Domains operate together at one half the frequency of the CLK sources. For example, if the CLK frequency is 100 Mhz, the JTAG operations will occur at 50 Mhz. Thus the second benefit of the present disclosure, stated in the DESCRIPTION OF THE RELATED ART section, of providing a reduced pin interface capable of operating at one half the frequency of the standard 5 pin JTAG interface is achieved.

It should be understood that while the SPC 306 and 2202 of the present disclosure has been shown as it would be used for accessing Tap Domains within ICs, the SPC is not limited to only accessing Tap Domains within ICs. Indeed, as the need may arise, the SPC can be used within embedded core circuits of an IC to allow accessing Tap Domains that exists within those embedded core circuits. The teaching in the present disclosure of how to use an SPC in an IC is sufficiently detailed to enable one skilled in the art to also use the SPC within an embedded core.

Although the present disclosure has been described in detail, it should be understood that various changes, substitutions, and alterations may be made without departing from the spirit and scope of the disclosure as defined by the appended claims.

What is claimed is:

1. An integrated circuit, comprising:
    A. tap domain test access port circuitry having a test data in (TDI) input lead, a test mode select (TMS) input lead, a test clock (TCK) input lead, and a test data out (TDO) output lead; and
    B. serial to parallel control circuitry having a TMS/TDI input lead, a clock input lead, and a TDO output lead, the controller circuitry being connected to the test access port circuitry by a TDI output lead coupled to the TDI input lead, a TMS output lead coupled to the TMS input lead, a TCK output lead coupled to the TCK input lead, and a TDO input lead coupled to the TDO output lead of the test access port circuitry and to the TDO output lead of the serial to parallel control circuitry, the serial to parallel control circuitry including:
        i. serial input parallel output circuitry having a serial input connected to the TMS/TDI input lead, a clock input connected with the clock input lead, a TDI output, and a TMS output;
        ii. update register circuitry having a first input connected to the TDI output of the serial input parallel output circuitry and a first output connected to the TDI output lead and having a second input connected to the TMS output of the serial input parallel output circuitry and a second output connected to the TMS output lead; and
        iii. tap state machine circuitry separate from the tap domain test access port circuitry, the tap state machine circuitry having a TCK input connected to the TCK output lead and a TMS input connected to the TMS output lead.

2. The integrated circuit of claim 1 including a clock circuit external of the integrated circuit connected to the clock input lead.

3. The integrated circuit of claim 1 including a clock circuit on the integrated circuit connected to the clock input lead.

4. The integrated circuit of claim 1 including a clock circuit on the integrated circuit connected to the clock input lead and supplying a functional clock signal to the integrated circuit.

5. The integrated circuit of claim 1 including an input buffer between the TMS/TDI input lead and the serial input of the serial input parallel output circuitry and a pull-up component at the input of the input buffer.

6. The integrated circuit of claim 1 in which the TMS/TDI input lead, the clock input lead, and the TDO output lead of the controller circuitry are accessible from external the integrated circuit.

7. The integrated circuit of claim 1 in which the serial to parallel control circuitry includes an output buffer having an input connected to the TDO input lead, an output connected to the TDO output lead of the serial to parallel control circuitry, and an output enable input, and the tap state machine circuitry has an enable output connected to the output enable input of the output buffer.

\* \* \* \* \*